US011378843B2

(12) United States Patent
Chen et al.

(10) Patent No.: US 11,378,843 B2
(45) Date of Patent: Jul. 5, 2022

(54) DISPLAY DEVICE

(71) Applicant: InnoLux Corporation, Miao-Li County (TW)

(72) Inventors: Yi-An Chen, Miao-Li County (TW); Kuan-Hung Kuo, Miao-Li County (TW); Tsau-Hua Hsieh, Miao-Li County (TW); Ming-I Chao, Miao-Li County (TW); Shu-Ming Kuo, Miao-Li County (TW); Chin-Lung Ting, Miao-Li County (TW); Chih-Yung Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/034,935

(22) Filed: Sep. 28, 2020

(65) Prior Publication Data
US 2021/0011342 A1   Jan. 14, 2021

Related U.S. Application Data

(63) Continuation of application No. 16/027,908, filed on Jul. 5, 2018, now abandoned.
(Continued)

(30) Foreign Application Priority Data

Feb. 12, 2018   (CN) .......................... 201810146834.1

(51) Int. Cl.
*G02F 1/1335*   (2006.01)
*G02F 1/13357*   (2006.01)
(Continued)

(52) U.S. Cl.
CPC .. *G02F 1/133617* (2013.01); *G02F 1/133512* (2013.01); *G02F 1/133514* (2013.01);
(Continued)

(58) Field of Classification Search
CPC ......... G02F 1/133617; G02F 1/133553; G02F 1/133512; G02F 1/133514; H01L 33/44; H01L 25/0753
See application file for complete search history.

(56) References Cited

U.S. PATENT DOCUMENTS

| 2006/0238671 A1* | 10/2006 | Kim | ...................... B82Y 20/00 |
| | | | 349/71 |
| 2010/0289727 A1* | 11/2010 | Miller | .................. G09G 3/2003 |
| | | | 345/76 |

(Continued)

FOREIGN PATENT DOCUMENTS

EP   3 125 032 A1   2/2017

OTHER PUBLICATIONS

European Office Action dated Apr. 8, 2021, issued in application No. EP 18 185 267.4.
(Continued)

*Primary Examiner* — James A Dudek
(74) *Attorney, Agent, or Firm* — McClure, Qualey & Rodack, LLP

(57) ABSTRACT

A display device is provided. The display device includes a substrate and a plurality of pixels disposed on the substrate. One of the pixels includes a color conversion layer, a dielectric layer disposed on the color conversion layer, and a light filter layer disposed on the dielectric layer. The display device also includes a first light shielding layer, a second light shielding layer, and a plurality of light emitting diodes. The first light shielding layer defines a plurality of openings, wherein at least one of the color conversion layer, the dielectric layer and the light filter layer is disposed in the openings. The second light shielding layer is disposed on the substrate and at least partially overlapped with the first light shielding layer. The second light shielding layer defines
(Continued)

another plurality of openings, and the light emitting diodes are disposed in the another openings.

19 Claims, 24 Drawing Sheets

Related U.S. Application Data

(60) Provisional application No. 62/539,579, filed on Aug. 1, 2017.

(51) Int. Cl.
  *H01L 33/44* (2010.01)
  *H01L 25/075* (2006.01)
(52) U.S. Cl.
  CPC .... *G02F 1/133553* (2013.01); *H01L 25/0753* (2013.01); *H01L 33/44* (2013.01)

(56) References Cited

U.S. PATENT DOCUMENTS

| | | |
|---|---|---|
| 2014/0367711 A1 | 12/2014 | Bibl et al. |
| 2015/0042933 A1* | 2/2015 | Ueki ................. G02F 1/133514 349/108 |
| 2017/0117257 A1* | 4/2017 | Lee ......................... H01L 33/20 |
| 2017/0179438 A1 | 6/2017 | Xu |

OTHER PUBLICATIONS

European office action dated Jul. 28, 2020, issued in application No. EP 18 185 267.4.

* cited by examiner

DISPLAY DEVICE

CROSS REFERENCE TO RELATED APPLICATIONS

This application is a Continuation of application Ser. No. 16/027,908, filed Jul. 5, 2018, which claims priority of a provisional application of U.S. Patent Application No. 62/539,579 filed on Aug. 1, 2017, and also claims priority of China Patent Application No. 201810146834.1 filed on Feb. 12, 2018, the entirety of which is incorporated by reference herein.

BACKGROUND OF THE INVENTION

Field of the Invention

The embodiments of the disclosure relate to a display device, and in particular to a display device having high penetration or wide color gamut.

Description of the Red Pixel Related Art

As digital technology develops, display devices are being used more widely. For example, display devices have been applied in modern information and communication devices such as televisions, notebooks, computers, mobile phones or smartphones. In addition, each generation of display devices has been developed to be thinner, lighter, less, or more fashionable than the previous generation, high luminance or high chroma. These display devices include light-emitting diode display devices.

Since mass production has recently become a trend in the display device industry, any increase in the yield of manufacturing display devices will reduce costs or result in huge economic benefits. However, existing display devices have not been satisfactory in every respect.

Therefore, an uncomplicated, cost-effective process for manufacturing display devices with high-quality luminance or high color gamut is needed.

BRIEF SUMMARY OF THE INVENTION

The embodiments of the present disclosure provide a display device. The display device includes a substrate and a plurality of pixels disposed on the substrate. One of the pixels includes a color conversion layer, a dielectric layer disposed on the color conversion layer, and a light filter layer disposed on the dielectric layer. The display device also includes a first light shielding layer, a second light shielding layer, and a plurality of light emitting diodes. The first light shielding layer defines a plurality of openings, wherein at least one of the color conversion layer, the dielectric layer and the light filter layer is disposed in the openings. The second light shielding layer is disposed on the substrate and at least partially overlapped with the first light shielding layer. The second light shielding layer defines another plurality of openings, and the light emitting diodes are disposed in the another openings.

The embodiments of the present disclosure provide a display device. The display device includes a substrate and a plurality of pixels disposed on the substrate. One of the plurality of pixels includes: a first color conversion layer, a first light filter layer disposed on the first color conversion layer, and a dielectric layer disposed between the first light filter layer and the first color conversion layer. The first light filter layer is a first yellow light filter layer, and the first color conversion layer is a red color conversion layer. A refractive index of the dielectric layer is less than a refractive index of the first light filter layer, and the first light filter layer is the uppermost layer among the color conversion layer, the dielectric layer, and the first light filter layer. The display device further includes a first light shielding layer, a second light shielding layer and a plurality of light emitting diode. The first light shielding layer defines plurality of openings, wherein at least one of the first color conversion layer, the dielectric layer and the first light filter layer is disposed in the plurality of openings. The second light shielding layer is posed on the substrate and at least partially overlapped with the first light shielding layer, and the second light shielding layer defining another plurality of openings. The plurality of light emitting diodes are disposed in the another plurality of openings.

The embodiments of the present disclosure provide a display device. The display device includes a substrate and a plurality of pixels disposed on the substrate. One of the plurality of pixels includes: a first color conversion layer, a first light filter layer disposed on the first color conversion layer, and a dielectric layer disposed between the first light filter layer and the first color conversion layer. The first light filter layer is a first yellow light filter layer, and the first color conversion layer is a green color conversion layer. A refractive index of the dielectric layer is less than a refractive index of the first light filter layer, and the light filter layer is the uppermost layer among the color conversion layer, the dielectric layer, and the light filter layer. The display device further includes a first light shielding layer, a second light shielding layer and a plurality of light emitting diode. The first light shielding layer defines a plurality of openings, wherein at least one of the first color conversion layer, the dielectric layer and the first light filter layer is disposed in the plurality of openings. The second light shielding layer is disposed on the substrate and at least partially overlapped with the first light shielding layer, and the second light shielding layer defining another plurality of openings. The plurality of light emitting diodes are disposed in the another plurality of openings.

BRIEF DESCRIPTION OF THE DRAWINGS

The disclosure may be more fully understood by reading the subsequent detailed description and examples with references made to the accompanying drawings, wherein.

DETAILED DESCRIPTION OF THE INVENTION

Figure 1:
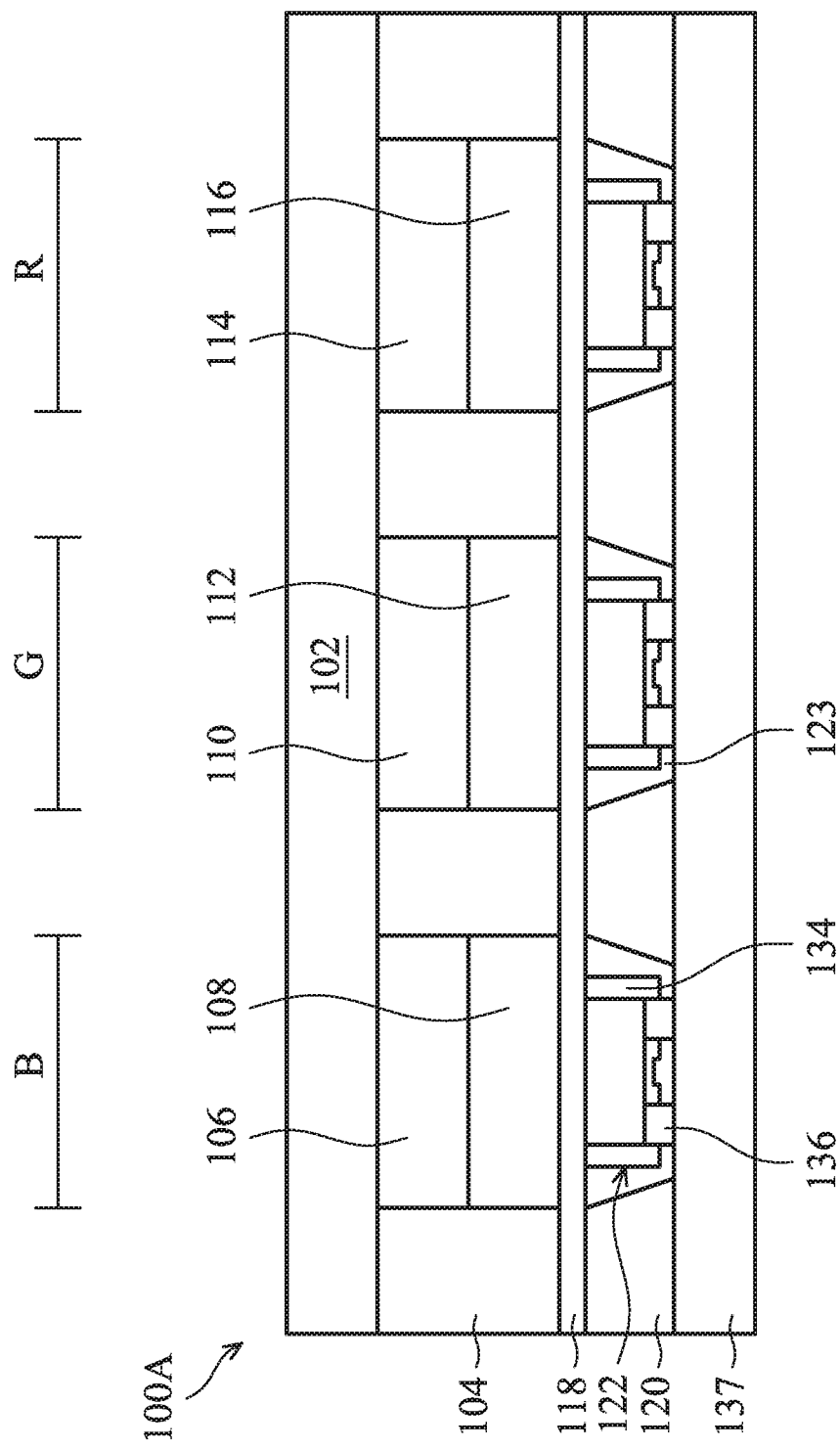
FIG. 1 is a cross-sectional view of a display device in accordance with some embodiments of the present disclosure.

The display device of the present disclosure is described in detail in the following description. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

The term "substrate" is meant to include devices formed within a substrate or the layers overlying the substrate. All transistor element needed may be already formed over the substrate. However, the substrate is represented with a flat surface in order to simplify the drawing. The term "substrate surface" is meant to include the uppermost exposed layers on a substrate, such as an insulating layer and/or metallurgy lines.

The thickness of a structure described in the embodiments of the disclosure indicates a value for the average thickness of the structure after deleting outliers. The outliers can be the thickness of an edge, an obvious micro-trench, or an obvious micro-raised area. After deleting the outliers, most values of the thickness are within a range of plus or minus three standard deviations.

Referring to FIG. 1, FIG. 1 is a cross-sectional view of a display device 100A in accordance with some embodiments of the present disclosure. As shown in FIG. 1, the display device 100A includes a blue pixel B, a green pixel G, and a red pixel R which emit different wavelength of light respectively. In some embodiments, the display device 100A further includes, but is not limited to, other pixels such as an infrared pixel or a white pixel.

In some embodiments, the display device 100A includes a substrate 102. The substrate 102 may be used as a protective element or a package element of the display device 100A to prevent material layers or elements such as light filter layer, dielectric layer, color conversion layer or display layer from physical or chemical damage. The substrate 102 may include, but is not limited to, a transparent substrate such as a glass substrate, a ceramic substrate, a plastic substrate or another applicable substrate. In addition, the substrate 102 may include phosphosilicate glass (PSG), borophosphosilicate glass (BPSG), silicon oxide, silicon nitride, silicon oxynitride, high-k material, any other applicable dielectric material, and a combination thereof. The high-k material refers to a material with a high dielectric constant and it may include, but is not limited to, metal oxide, metal nitride, metal silicide, transition metal oxide, transition metal nitride, transition metal silicide, transition metal oxynitride, metal aluminate, zirconium silicate, or zirconium aluminate.

In some embodiments, the display device 100A includes a light shielding layer 104. The light shielding layer 104 is disposed on the substrate 102 and between two adjacent pixels. As shown in FIG. 1, the patterned light shielding layer 104 defines a plurality of openings which can differentiate or define different pixels such as the blue pixel B, the green pixel G and the red pixel R. The light shielding layer 104 is used to shield the elements or region which is not used to display colors in the display device 100A. For example, the light shielding layer 104 may be used to shield the data lines or scan lines. The light shielding layer 104 may include, but is not limited to, black photoresist, black printing ink, black resin or any other suitable light-shielding materials or light-shielding colors. Generally, the light-shielding materials may prevent light from being transmitted, but it is not limited to the absorption of light. The light-shielding materials may also be highly reflective. For example, the light-shielding materials are white or highly reflective, and are not limited to consisting of one material. In some embodiments, the light shielding layers 104 have an outer portion and an inner portion covered by the outer portion. For example, the outer portion may be made of a highly reflective material (such as a metal or a white ink) or a highly absorptive material (such as a black ink or a black photoresist), and the inner portion is, but is not limited to, multiple layers structure made of transparent or other materials.

In some embodiments, as shown in FIG. 1, the plurality of pixels, such as the blue pixel B, the green pixel G and the red pixel R, includes a color conversion layer or a light filter layer, respectively. For example, a blue light filter layer 106 and a blue color conversion layer 108 disposed on the blue light filter layer 106 are formed in the blue pixel B, a yellow light filter layer 110 and a green color conversion layer 112 disposed on the yellow light filter layer 110 are formed in the green pixel G, and a yellow light filter layer 114 and a red color conversion layer 116 disposed on the yellow light filter layer 114 are formed in the red pixel R.

The light filter layer may allow specific wavelength of light to pass through. For example, the blue light filter layer allows wavelength of light between about 400 nm and 500 nm to pass through, the yellow light filter layer allows wavelength of light between about 500 nm and 570 nm to pass through, and the red light filter layer allows wavelength of light between about 620 nm and 750 nm to pass through. The aforementioned light filter layer and corresponding wavelength of light are merely example and not limited, and the scope of disclosure is not intended to be limiting.

Figure 3:
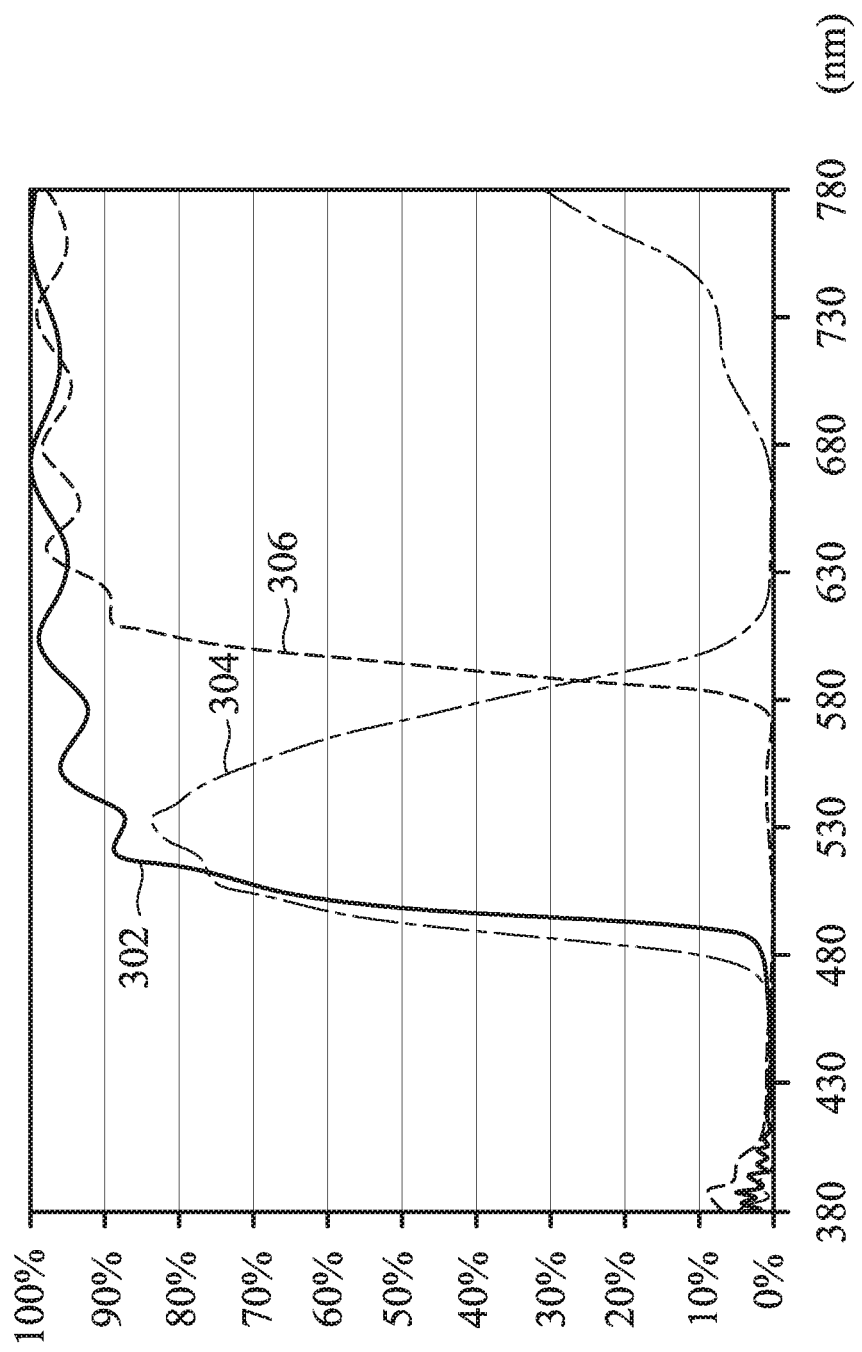
FIG. 3 is a graph of transmittance against wavelength of light passing through a red, a green and a yellow filter layer, according to some embodiments.

In some embodiments, as shown in FIG. 1, the yellow light filter layer 110 and the yellow light filter layer 114 are disposed in the green pixel G and the red pixel R, respectively. The yellow light filter layer 110 and the yellow light filter layer 114 may be formed in the same process or different processes. When the yellow light filter layer 110 and the yellow light filter layer 114 are formed in different processes, the thickness of the yellow light filter layer 110 and the yellow light filter layer 114 may be different. Referring to FIG. 3, FIG. 3 is a graph of transmittance against wavelength of light passing through a red, a green or a yellow filter layer, according to some embodiments. Waveband 302 means that a spectra of transmittance against wavelength of light passing through the yellow filter layer, waveband 304 means that a spectra of transmittance against wavelength of light passing through the green filter layer, and waveband 306 means that a spectra of transmittance against wavelength of light passing through the red filter layer. As shown in FIG. 3, the transmittance of the yellow filter layer is greater than 95% in wavelength between about 500 nm and 780 nm. The transmittance of the green filter layer in wavelength between about 500 nm and 570 nm is less than that of the yellow filter layer. Therefore, the light-emitting efficiency of the green pixel is enhanced by replacing the green light filter with the yellow filter layer.

Moreover, as shown in FIG. 3, the transmittance of light passing through the yellow filter layer in wavelength between about 620 nm and 750 nm is substantially equivalent to the transmittance of light passing through the red filter layer, and keeps in 95% in wavelength between about 620 nm and 750 nm. Therefore, the red filter layer may be replaced with the yellow filter layer. By disposing the yellow filter layer in the green pixel G or the red pixel R, the light-emitting efficiency is enhanced. Moreover, since the process for forming the display device 100A is simplified (e.g. two processes of disposing red filter layer and the green filter layer are replaced with one process of disposing the yellow filter layers), the cost or the production time are reduced.

In some embodiments, as shown in FIG. 1, the blue color conversion layer 108 is correspondingly formed in the blue pixel B, the green color conversion layer 112 is correspondingly formed in the green pixel G, and the red color conversion layer 116 is correspondingly formed in the red pixel R. The material of the blue color conversion layer 108, the green color conversion layer 112 and the red color conversion layer 116 include, but are not limited to, a quantum dot film, a fluorescent material, or other light conversion materials. For example, the blue color conversion layer 108, the green color conversion layer 112 and the red color conversion layer 116 are organic or inorganic layers, which mixed with a quantum dot. The quantum dot may include, but is not limited to, zinc, cadmium, selenium, sulfur, InP, GaSb, GaAa or a combination thereof. The grain diameter of the quantum dot may range from about 1 nm-30 nm. When the quantum dots with different grain diameter are excited, the spectrum of light is altered and different wavelength of light is emitted. For example, the excitation of the quantum dots with smaller grain diameter results in emitting shorter wavelength of light (such blue light), the excitation of the quantum dots with greater grain diameter results in emitting longer wavelength of light (such red light). Therefore, by adjusting the grain diameter of the quantum dot, different wavelength of light are generated and thereby a display device with wide color gamut is achieved. For example, the blue color conversion layer 108 mixed with a quantum dot having the first grain diameter may emit light of a blue color after excitation. The green color conversion layer 112 mixed with a quantum dot having the second grain diameter may emit light of a green color after excitation. The red color conversion layer 116 mixed with a quantum dot having the third grain diameter may emit light of a red color after excitation. In some embodiments, the color conversion layer is an organic layer or an inorganic layer mixed or mixed with perovskite. In some embodiments, the color conversion layer is a fluorescent material such as a material absorbing shorter wavelength of light and emitting longer wavelength of light.

In some embodiments, the display device 100A further includes a color conversion enhancement layer (not shown). The color conversion enhancement layer may be disposed between the light filter layer and the color conversion layer. The color conversion enhancement layer may include, but is not limited to, a material reflecting blue light. Unexcited blue light may be reflected back to the blue color conversion layer 108, the green color conversion layer 112 or the red color conversion layer 116 by the color conversion enhancement layer, and thereby the blue light without conversion can excite through the blue color conversion layer 108, the green color conversion layer 112 or the red color conversion layer 116. As a result, the efficiency of light transformation is enhanced.

As shown in FIG. 1, the display device 100A includes an adhesive layer 118. The adhesive layer 118 is used to attach the light-emitting element or a substrate having a light-emitting display layer. The material of the adhesive layer light-emitting layer 126 includes, but is not limited to, optical adhesive (OCA), optical clear resin (OCR) or other suitable transparent adhesive materials, or a combination thereof.

As shown in FIG. 1, the display device 100A includes a light shielding layer 120. The light shielding layer 120 substantially overlaps the light shielding layer 104, that is to say, the light shielding layer 120 and the light shielding 140 may be separated via an intermediate layer (e.g. the adhesive layer 118, a dielectric layer 148, or a spacer layer 154 discussed below), but the present disclosure is not limited thereto. For example, the light shielding layer 120 can completely or partially overlap with the light shielding layer 104. The light shielding layer 120 defines a plurality of openings. At least one light-emitting diode 122 is disposed in the opening. In some embodiments, the material of the light shielding layer 120 is the same as or similar to that of the light shielding layer 104. In some embodiments, the material of the light shielding layer 120 is different from the light shielding layer 104. In some embodiments, from a cross-sectional view, the shape of the light shielding layer 120 is trapezoidal, rectangular, arc-shaped, other suitable shapes, or a combination thereof.

In some embodiments, as shown in FIG. 1, the display device 100A includes the light-emitting diode 122 and a substrate 137. In some embodiments, the light-emitting diodes 122 include, but are not limited to, a quantum dot (QD), a fluorescent material, a phosphor material, a light-emitting diode (LED), a micro light-emitting diode or a mini light-emitting diode. In some embodiments, the size of the chip of the light-emitting diode is, but is not limited to, in a range of about 300 µm to 10 mm, the size of the chip of the mini light-emitting diode is, but is not limited to, in a range of about 100 µm to 300 µm, the size of the chip of the micro light-emitting diode is, but is not limited to, in a range of about 1 µm to 100 µm. In other embodiments, the light-emitting diode 122 includes an organic light-emitting diode (OLED). The structure of the display device 100A can be adjusted, the scope of disclosure is not intended to be limiting.

As shown in FIG. 1, the light-emitting diode 122 can be disposed in the blue pixel B, the green pixel G and the red pixel R, respectively. As shown in FIG. 1, the light-emitting diodes 122 are disposed in the openings, which are differentiated or defined by the light shielding layer 120. The light-emitting diode 122 can be electrically connected to the substrate 137 by a conductive layer 136. In some embodiments, the conductive layer 136 is a bonding material. In addition, a filler 123 can be disposed between the substrate 137 and the adhesive layer 118. In some embodiments, the filler 123 is, but is not limited to, such as a transparent material. The substrate 137 have many circuits (not shown) formed therein, the circuits include such as a thin film transistor (TFT) or other elements.

Figure 2:
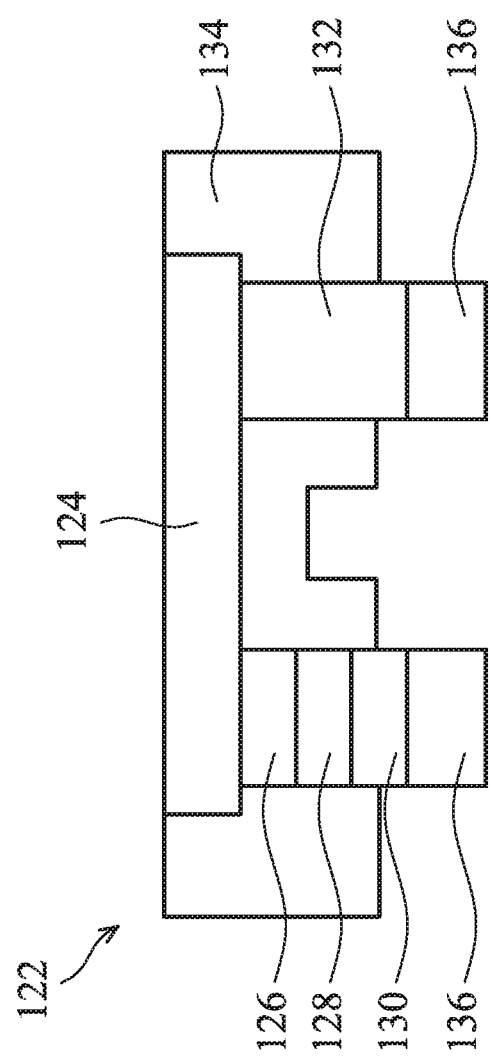
FIG. 2 is a cross-sectional view of a light-emitting element in accordance with some embodiments of the present disclosure.

Referring to FIG. 2, FIG. 2 is a cross-sectional view of the light-emitting diode 122 in accordance with some embodiments of the present disclosure. As shown in FIG. 2, the light-emitting diode 122 includes a semiconductor layer 124, a light-emitting layer 126, and a semiconductor layer 128. The semiconductor layer 124 and the semiconductor layer 128 connect a conductive pad 130 and a conductive pad 132, respectively. The semiconductor layer 124 and the semiconductor layer 128 may include, but are not limited to, an element semiconductor which may include amorphous-Si, poly-Si, germanium; a compound semiconductor which may include gallium nitride (GaN), silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy, GaInAsP alloy, or a combination thereof. The semiconductor layer 124 and the semiconductor layer 128 may also include, but are not limited to, metal oxide such as indium gallium zinc oxide (IGZO), indium zinc oxide (IZO), indium gallium zinc oxide (IGZTO), or organic semiconductor including polycyclic aromatic compound, or a combination thereof.

As shown in FIG. 2, the light-emitting layer 126 is disposed between the semiconductor layer 124 and the semiconductor layer 128. The light-emitting layer 126 may include, but is not limited to, homojunction, heterojunction, single-quantum well (SQW), multiple-quantum well (MQW) or any other applicable structure. In some embodiments, the light-emitting layer 126 includes un-doped n type $In_xGa_{(1-x)}N$. In other embodiments, the light-emitting layer 126 includes such materials as $Al_xIn_yGa_{(1-x-y)}N$ or other materials. Moreover, the light-emitting layer 126 may include a multiple-quantum well structure with multiple-quantum layers (such as InGaN) or barrier layers (such as GaN) arranged alternately. Moreover, the light-emitting layer 126 may be formed, but is not limited to, by metal organic chemical vapor deposition (MOCVD), molecular beam epitaxy (MBE), hydride vapor phase epitaxy (HVPE), liquid phase epitaxy (LPE) or any other applicable chemical vapor deposition process.

As shown in FIG. 2, a protective layer 134 is disposed on sidewalls of the semiconductor layer 124, the light-emitting layer 126, the semiconductor layer 128, portions of the conductive pad 130 or the conductive pad 132. In some embodiments, the protective layer 134 is, but is not limited to, a reflective material or light absorptive material. When the protective layer 134 is the reflective material, the protective layer 134 may include, but is not limited to, a multi-layer dielectric film of distributed Bragg reflector (DBR), a mixed layer material (such as a structure of dielectric layer/metal layer/dielectric layer) or a Omni-Directional reflector (ODR). When the protective layer 134 is the light absorptive material, the protective layer 134 may include photoresist materials (such as a white photoresist or a black photoresist). It is appreciated that the protective layer 134 includes at least one insulating layer to prevent from short with other metal layers. For example, the surface of the protective layer 134 contacting the conductive pad 130 and the conductive pad 132 is made of the insulating layer. In some embodiments, the outside of the protective layer 134 is made of the insulating layer.

As shown in FIG. 2, the conductive pad 130 is deposed adjacent to the semiconductor layer 128, the conductive pad 132 is deposed adjacent to the semiconductor layer 124. The material of the conductive pad 130 or the conductive pad 132 may include, but are not limited to, copper (Cu), aluminum (Al), molybdenum (Mo), tungsten (W), gold (Au), chromium (Cr), nickel (Ni), platinum (Pt), titanium (Ti), iridium (Ir), Rhodium (Rh), the above alloys, the above combination or any other applicable materials.

In addition, as shown in FIG. 2, the light-emitting diode 122 includes a conductive layer 136. The conductive layer 136 may be used to electrically connected to the light-emitting diode 122 or a substrate (not shown) having electronic elements or circuits. The conductive layer 136 may be such as a material with low melting point. In some embodiments, the conductive layer 136 is a eutectic material whose melting point is less than 300° C. The material of the conductive layer 136 may include, but is not limited to, a tin-indium alloy, a tin-zinc alloy, a tin-silver alloy, a gold-indium alloy, a gold-tin alloy or other suitable materials. In some embodiments, the conductive layer 136 is a stack structure with multi-layers such as a structure of Cu/Ni/Ag or Cu/Ni/Pt/Au, and the scope of disclosure is not intended to be limiting.

In some embodiments, the light-emitting diode 122 is formed by a flip-chip technique. In addition, the light-emitting diode 122 may be, but is not limited to, a lateral or a vertical structure. When the light-emitting diode 122 is the lateral structure, two electrodes are disposed in the same side of the light-emitting diode 122. When the light-emitting diode 122 is the vertical structure, two electrodes are disposed in different sides of the light-emitting diode 122, respectively.

The substrate having electronic elements is such as an integrated circuit (IC) substrate. The IC may include, but is not limited to, a micro-processor, a memory element and/or other elements. The IC may also include, but is not limited to, various passive and active elements such as a capacitor or other type of capacitor.

Figure 4:
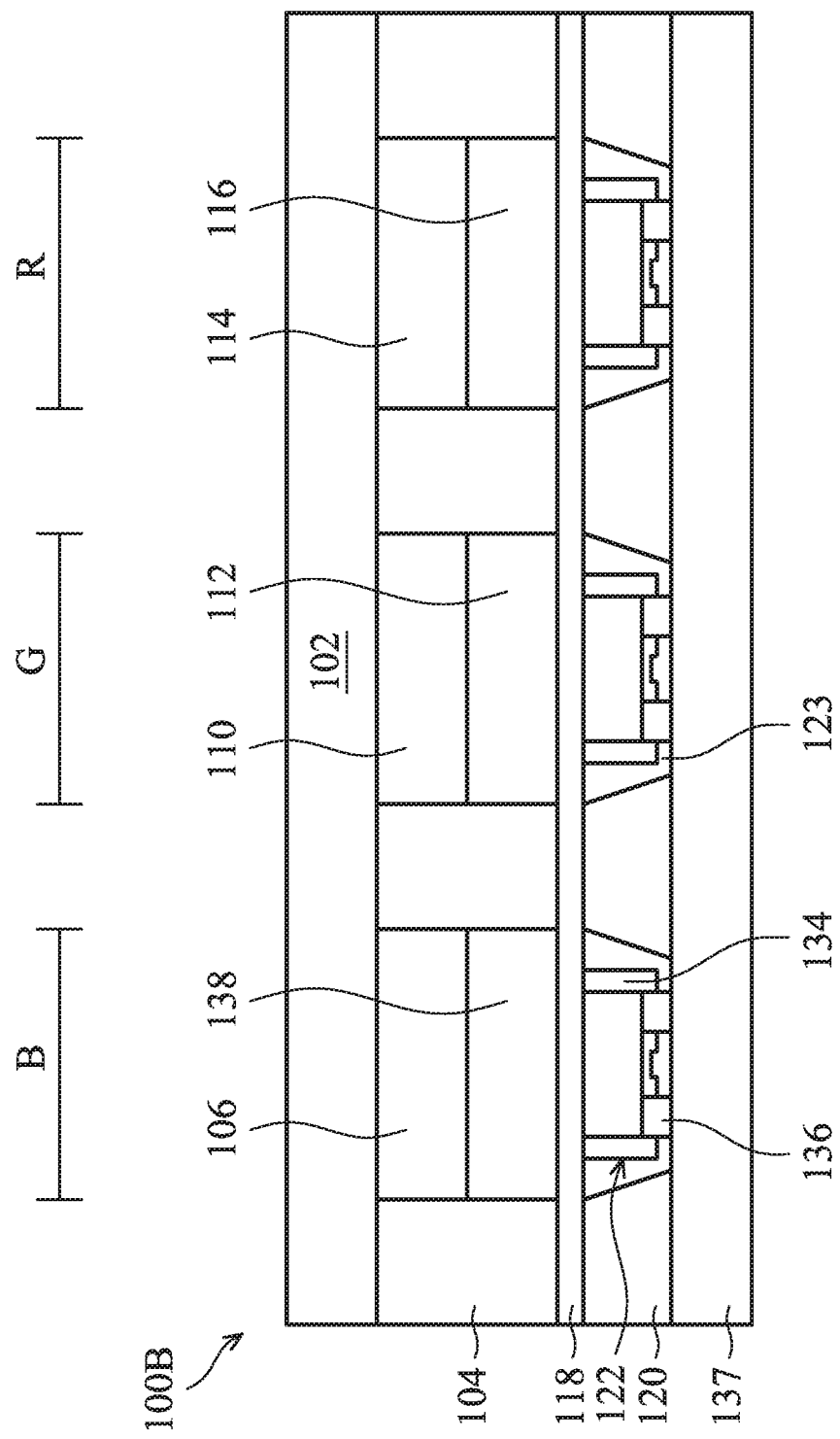
FIG. 4 is a cross-sectional view of a display device in accordance with some embodiments of the present disclosure.

Many variations and/or modifications can be made to embodiments of the disclosure. Referring to FIG. 4, FIG. 4 is a cross-sectional view of a display device 100B in accordance with some embodiments of the present disclosure. The display device 100B may be similar to the display device 100A, and one of the differences is that the blue color conversion layer 108 is replaced with a filling layer 138 in the blue pixel B of the display device 100B. In some embodiments, the light-emitting diode 122 emits color of blue light. Therefore, the blue color conversion layer 108 can be replaced with the filling layer 138. The material of the filling layer 138 is a highly reflective material or highly diffusional material. The material of the filling layer 138 may be, but is not limited to, such as silica gel, epoxy resin, poly(methyl methacrylate), poly(carbonate) or other composite materials.

Figure 5:
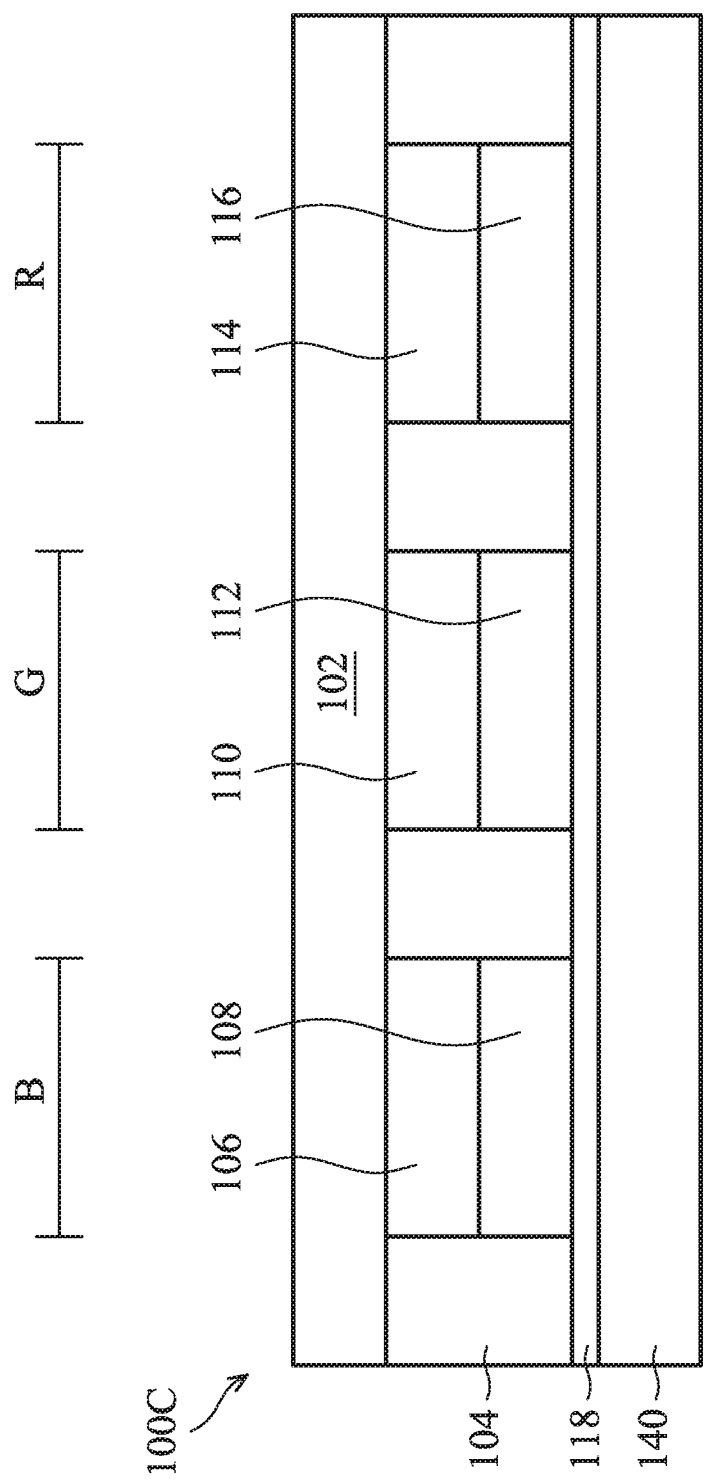
FIG. 5 is a cross-sectional view of a display device in accordance with some embodiments of the present disclosure.

Many variations and/or modifications can be made to embodiments of the disclosure. Referring to FIG. 5, FIG. 5 is a cross-sectional view of a display device 100C in accordance with some embodiments of the present disclosure. The display device 100C may be similar to the display device 100A, and one of the differences is that a liquid-crystal display element 140 is disposed under the adhesive layer 118. In some embodiments, the adhesive layer 118 is not disposed.

In some embodiments, the liquid-crystal display element 140 is an element including liquid crystal display (LCD). The liquid-crystal display element 140 at least includes a first element layer 142, a display layer 144 and a second element layer 146. In other embodiments, the liquid-crystal display element 140 includes other elements. The first element layer 142 includes a top polarizing layer (not shown). The top polarizing layer is, but is not limited to, a metal periodic nanostructure formed by using nanoimprinting method. The top polarizing layer is such as in cell (or inner) polarizer. The nanoimprinting may be formed by such as thermoplastic nanoimprint lithography, resist-free direct thermal nanoimprint lithography or photo nanoimprint lithography.

In some embodiments, the display layer 144 is disposed between the first element layer 142 and the second element layer 146. The first element layer 142 and the second element layer 146 include some circuits or polyimide layer (not shown). The display layer 144 utilizes the properties of liquid-crystal molecules, which have different polarization or reflection effects to lights under different arrangement states, so as to control the amounts of the transmitting lights, and thus creates images (to display different gray levels). The display layer 144 may be applied in different liquid-crystal mode in accordance with the structure of the electrode or orientation of the polyimide layer. For example, the display layer 144 may include, but is not limited to, a twisted nematic (TN) liquid-crystal, a super twisted nematic (STN) liquid-crystal, a double layer super twisted nematic (DSTN) liquid-crystal, a vertical alignment (VA) liquid-crystal, an in-plane switching (IPS) liquid-crystal, a cholesteric liquid-crystal, a blue phase liquid-crystal, a fringe-field switching (FFS) liquid-crystal, or any other suitable liquid-crystal.

In some embodiments, the second element layer 146 includes a bottom polarizing layer (not shown), wherein the display layer 144 is disposed between the top polarizing layer and the bottom polarizing layer. The bottom polarizing layer may include a protective film, tri-acetate cellulose (TAC), polyvinyl alcohol (PVA), tri-acetate cellulose (TAC), a pressure sensitive adhesive (PSA) or a release film. The polarizing layer may also include a polarizing substrate (such as PVA (Polyvinyl alcohol) substrate), the polarizing substrate is a transparent substrate with TAC attaching on different sides, and TAC may be used to support or protect the polarizing substrate, or TAC may be used to reduce the polarizing substrate from retraction. The bottom polarizing layer may be directly attached to the substrate (not shown) of the second element layer 146. By adjusting the orientation of liquid-crystal molecules of the display layer 144 with the penetration axis of the top polarizing layer and the penetration axis of the bottom polarizing layer, the amounts of the transmitting lights can be controlled. In some embodiments, a backlight module (not shown) is further disposed under the second element layer 146.

In some embodiments, the second element layer 146 may include thin film transistor (TFT). The electrode of the TFT may include, but is not limited to, metal oxide such as indium tin oxide (ITO), tin oxide (SnO), indium zinc oxide (IZO), indium gallium zinc oxide (IGZO), indium tin zinc oxide (ITZO), antimony tin oxide (ATO), antimony zinc oxide (AZO), a combination thereof, or any other suitable transparent conductive oxide.

The second element layer 146 may include substrate such as a glass substrate, a plastic substrate or other suitable substrate. The material of the substrate may include, but is not limited to, glass, quartz, organic polymer, inorganic polymer or metal. The material of the substrate may also include, but is not limited to, silicon dioxide, phosphosilicate glass (PSG), low dielectric constant (low-k) dielectric material or other suitable dielectric material. The low dielectric constant dielectric materials include, but are not limited to, fluorinated silica glass (FSG), carbon doped silicon oxide, parylene, polyimide or a combination thereof. The second element layer 146 may include, but is not limited to, gate driver circuit, data driver circuit, demultiplexer or other elements.

Figure 7:
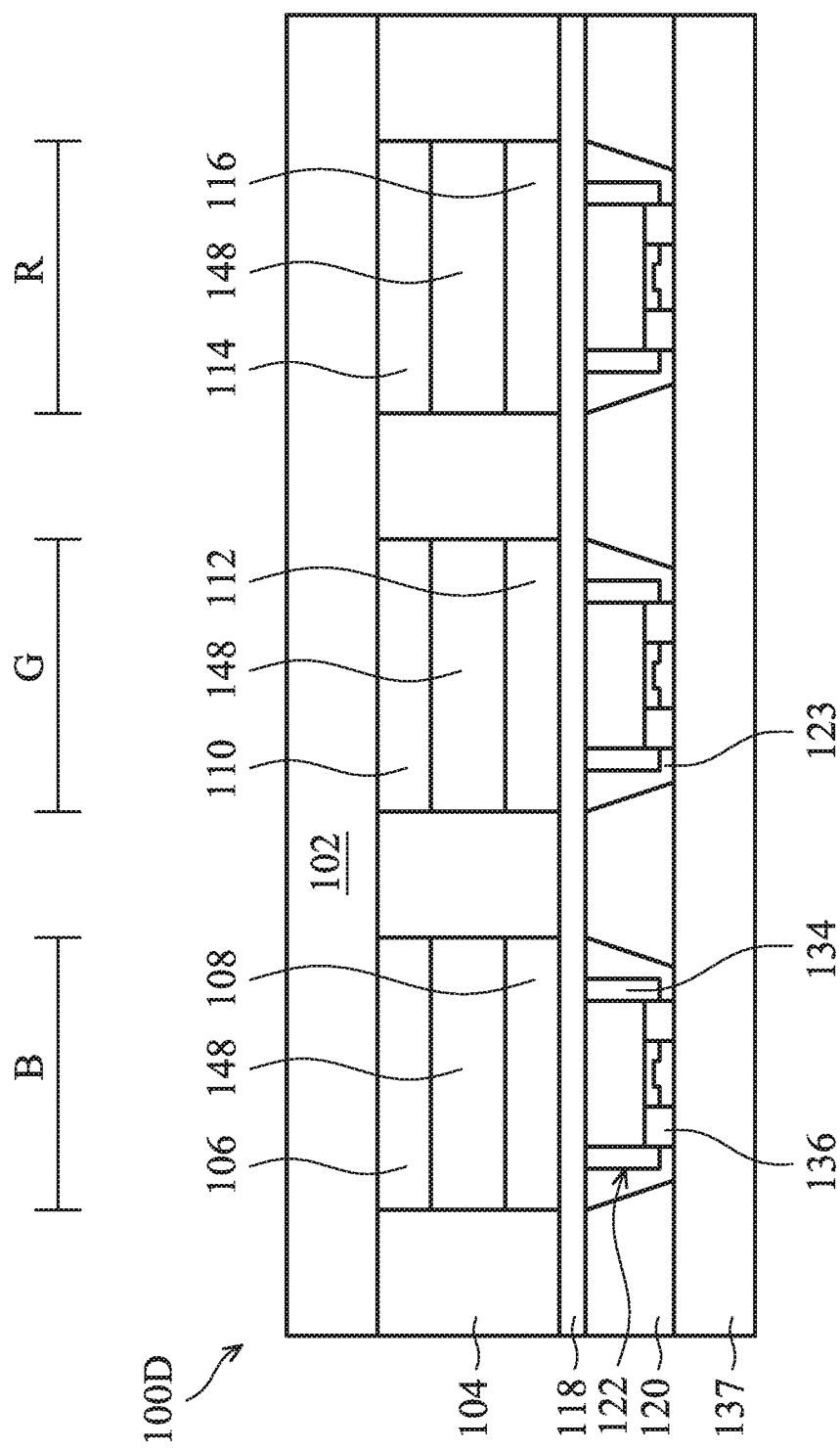
FIGS. 7-17 are cross-sectional views of a display device in accordance with some embodiments of the present disclosure.

Many variations and/or modifications can be made to embodiments of the disclosure. Referring to FIG. 7, FIG. 7 is a cross-sectional view of a display device 100D in accordance with some embodiments of the present disclosure. The display device 100D may be similar to the display device 100A, and one of the differences is that the display device 100D further includes a dielectric layer 148. In some embodiments, the dielectric layer 148 is disposed between the color conversion layer and the light filter layer. For example, the dielectric layer 148 is disposed between the blue light filter layer 106 and the blue color conversion layer 108 in the corresponding blue pixel B. Similarly, the dielectric layer 148 is disposed in the green pixel G or in the red pixel R. In some embodiments, the refractive index of the dielectric layer 148 is less than that of the color conversion layer. In some embodiments, the refractive index of the dielectric layer 148 is less than that of the light filter layer. In some embodiments, the difference between the refractive index of the dielectric layer 148 (n1) and the refractive index of the color conversion layer (n2) or the refractive index of the light filter layer (n3) is greater than or equivalent to 0.05, and less than or equivalent to 1 ($0.05 \leq n2-n1 \leq 1$ or $0.05 \leq n3-n1 \leq 1$). For example, the difference of the refractive index between color conversion layer (e.g. the blue color conversion layer 108, the green color conversion layer 112 or the red color conversion layer 116) and the dielectric layer 148 is greater than or equivalent to 0.05, and less than or equivalent to 1, respectively.

When the refractive index of a dielectric layer is less than the refractive index of the light filter layer or the refractive index of the color conversion layer, the possibility of excitation of light returning to the color conversion layer is enhanced. Therefore, the efficiency of light conversion is enhanced. In some embodiments, the dielectric layer 148 includes, but is not limited to, AlGaN, GaN, $SiO_2$, optical resin, epoxy, silicone.

Figure 6:
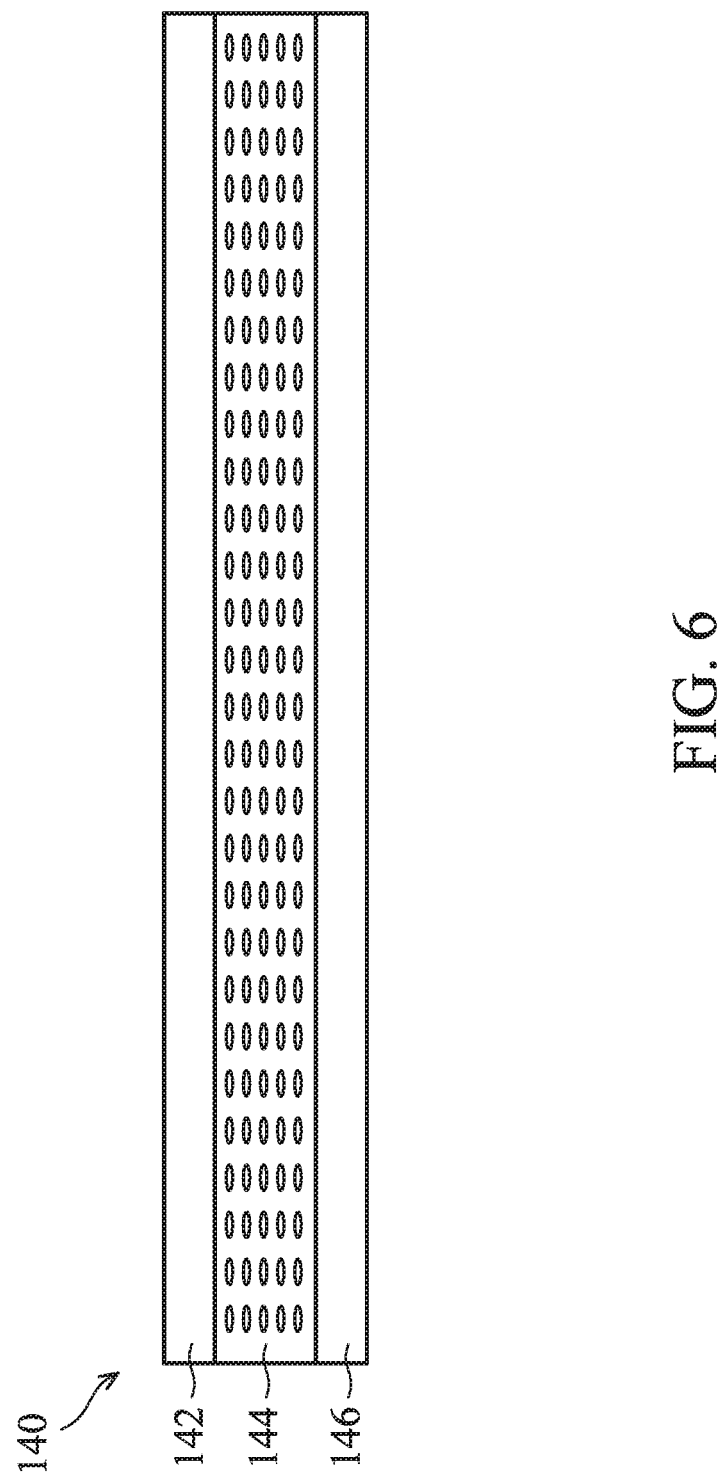
FIG. 6 is a cross-sectional view of a liquid-crystal substrate shown in FIG. 5 in accordance with some embodiments of the present disclosure.

Many variations and/or modifications can be made to embodiments of the disclosure. In some embodiments, the blue color conversion layer 108 shown in FIG. 7 can be replaced with the filling layer 138 shown in FIG. 4. In some embodiments, the light shielding layer 120 and the light-emitting diode 122 (which includes the elements of the light-emitting diode 122 shown in FIG. 2) shown in FIG. 7 can be replaced with the liquid-crystal display element 140 shown in FIG. 6. In some embodiments, when the light shielding layer 120 and the light-emitting diode 122 are replaced with the liquid-crystal display element 140, the adhesive layer 118 is not formed, and the scope of disclosure is not intended to be limiting.

Figure 8:
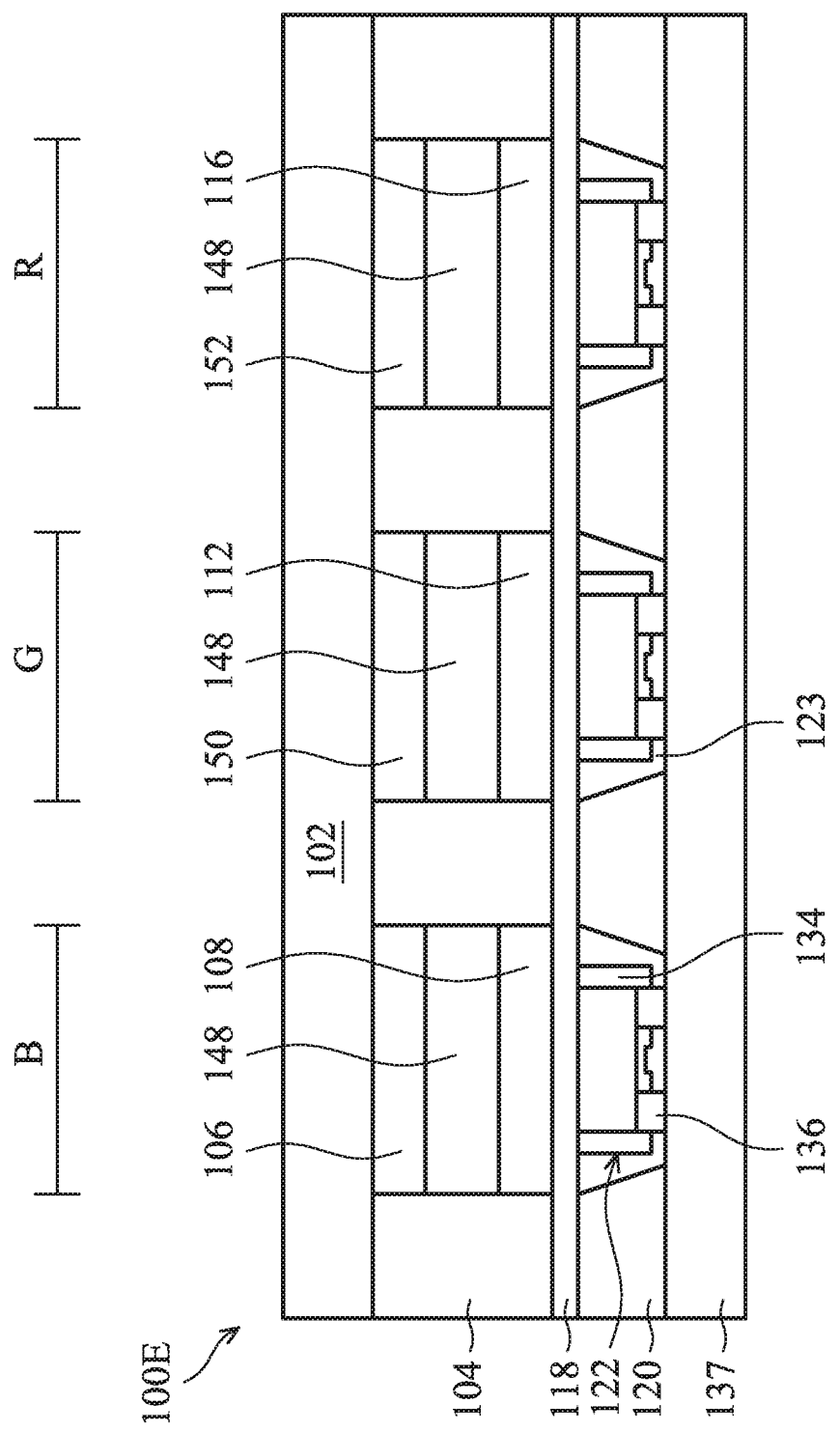

Many variations and/or modifications can be made to embodiments of the disclosure. Referring to FIG. 8, FIG. 8 is a cross-sectional view of a display device 100E in accordance with some embodiments of the present disclosure. The display device 100E may be similar to the display device 100D, and one of the differences is that the yellow light filter layer 110 disposed in the green pixel G is replaced with a green light filter layer 150, and the yellow light filter layer 114 disposed in the red pixel R is replaced with a red light filter layer 152. As mentioned above, the efficiency of the light conversion is enhanced when the dielectric layer is disposed between the light filter layer and the color conversion layer, so the colourimetric purity is enhanced by disposing the green light filter layer 150 in the green pixel G, and the red light filter layer 152 in the red pixel R.

Many variations and/or modifications can be made to embodiments of the disclosure. In some embodiments, the blue color conversion layer 108 shown in FIG. 8 can be replaced with the filling layer 138 shown in FIG. 4. In some embodiments, the light shielding layer 120 and the light-emitting diode 122 (which includes all the elements of the light-emitting diode 122 shown in FIG. 2) shown in FIG. 8 can be replaced with the liquid-crystal display element 140 shown in FIG. 6.

Figure 9:
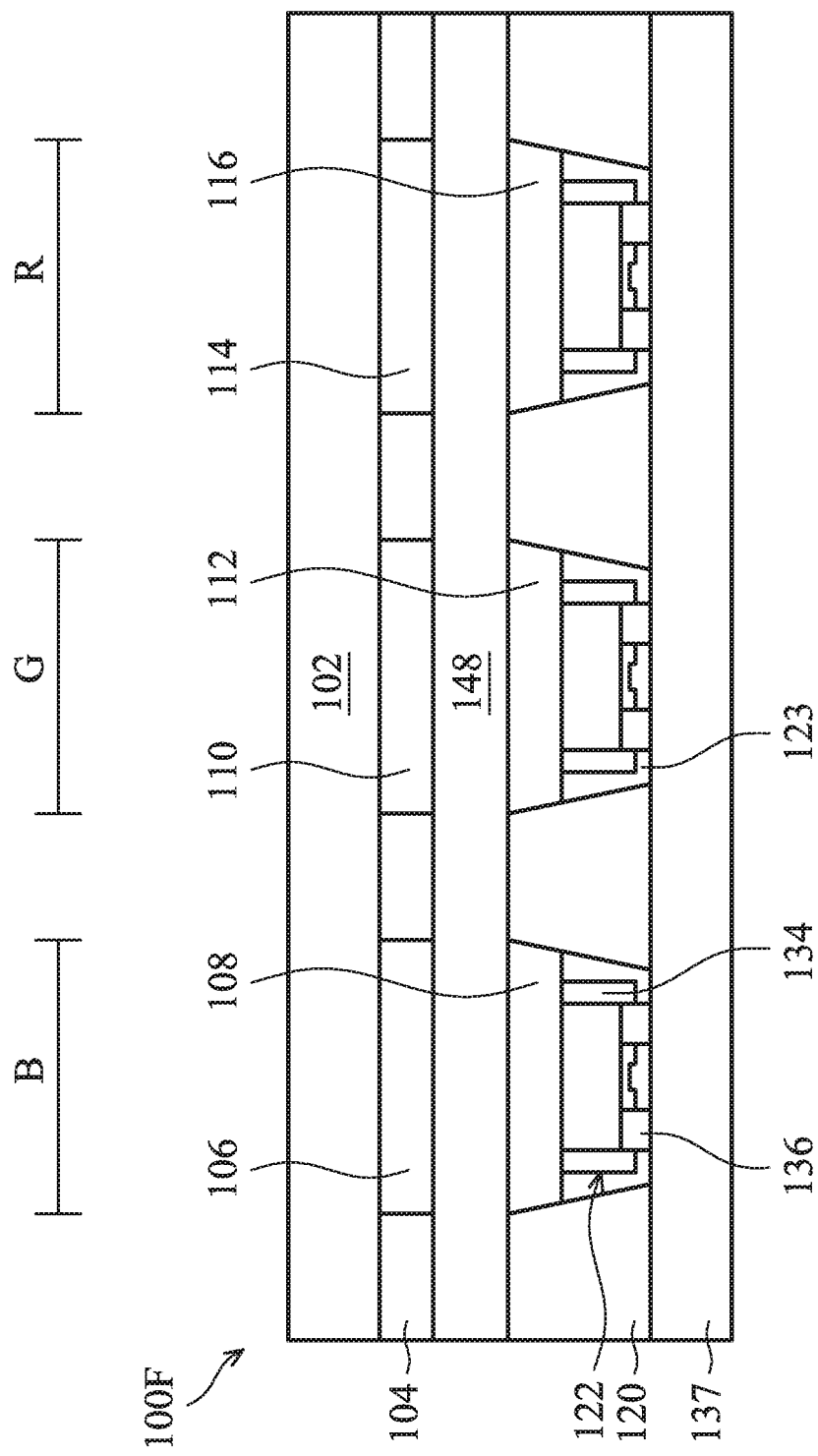

Many variations and/or modifications can be made to embodiments of the disclosure. Referring to FIG. 9, FIG. 9 is a cross-sectional view of a display device 100F in accordance with some embodiments of the present disclosure. The display device 100F may be similar to the display device 100D, and one of the differences is that the dielectric layer 148 is disposed between the light shielding layer 104 and the light shielding layer 120. As shown in FIG. 9, the color conversion layers (e.g. the blue color conversion layer 108, the green color conversion layer 112 and the red color conversion layer 116) can be disposed on the light-emitting diode 122, and the color conversion layers are in direct contact with the light-emitting diode 122. As shown in FIG. 9, the blue light filter layer 106 and the blue color conversion layer 108 are separated by the dielectric layer 148. The yellow light filter layer 110 and the green color conversion layer 112 are separated by the dielectric layer 148. Further, the yellow light filter layer 114 and the red color conversion layer 116 are separated by the dielectric layer 148. In this embodiment, the dielectric layer 148 may be a structure of a plane layer. The dielectric layer 148 is disposed on the surfaces of the blue color conversion layer 108, the green color conversion layer 112 and the red color conversion layer 116. In this embodiment, it is not necessary to make the light shielding layer 120 or the light shielding layer 104 separates the dielectric layer 148, respectively. In addition, the dielectric layer 148 is not necessary to be patterned, and the adhesive layer 118 can be omitted. As a result, the process is simplified or the cost is reduced. In some embodiments, the dielectric layer 148 is disposed on the substrate 102 on which the blue light filter layer 106, the yellow light filter layer 110, the yellow light filter layer 114 and the light shielding layer 104 are formed. The light-emitting diodes 122 (the blue color conversion layer 108, the green color conversion layer 112 and the red color conversion layer 116 were previously disposed on the light-emitting diodes 122 respectively) are disposed on the substrate 137. Next, the substrate 102 is combined with the substrate 137, and the dielectric layer 148 may be disposed between the substrate 102 and the substrate 137. As a result, the display device 100F is created.

Many variations and/or modifications can be made to embodiments of the disclosure. In some embodiments, the blue color conversion layer 108 shown in FIG. 9 can be replaced with the filling layer 138 shown in FIG. 4. In some embodiments, the light shielding layer 120 and the light-emitting diode 122 (which includes all the elements of the light-emitting diode 122 shown in FIG. 2) shown in FIG. 9 can be replaced with the liquid-crystal display element 140 shown in FIG. 6.

Figure 10:
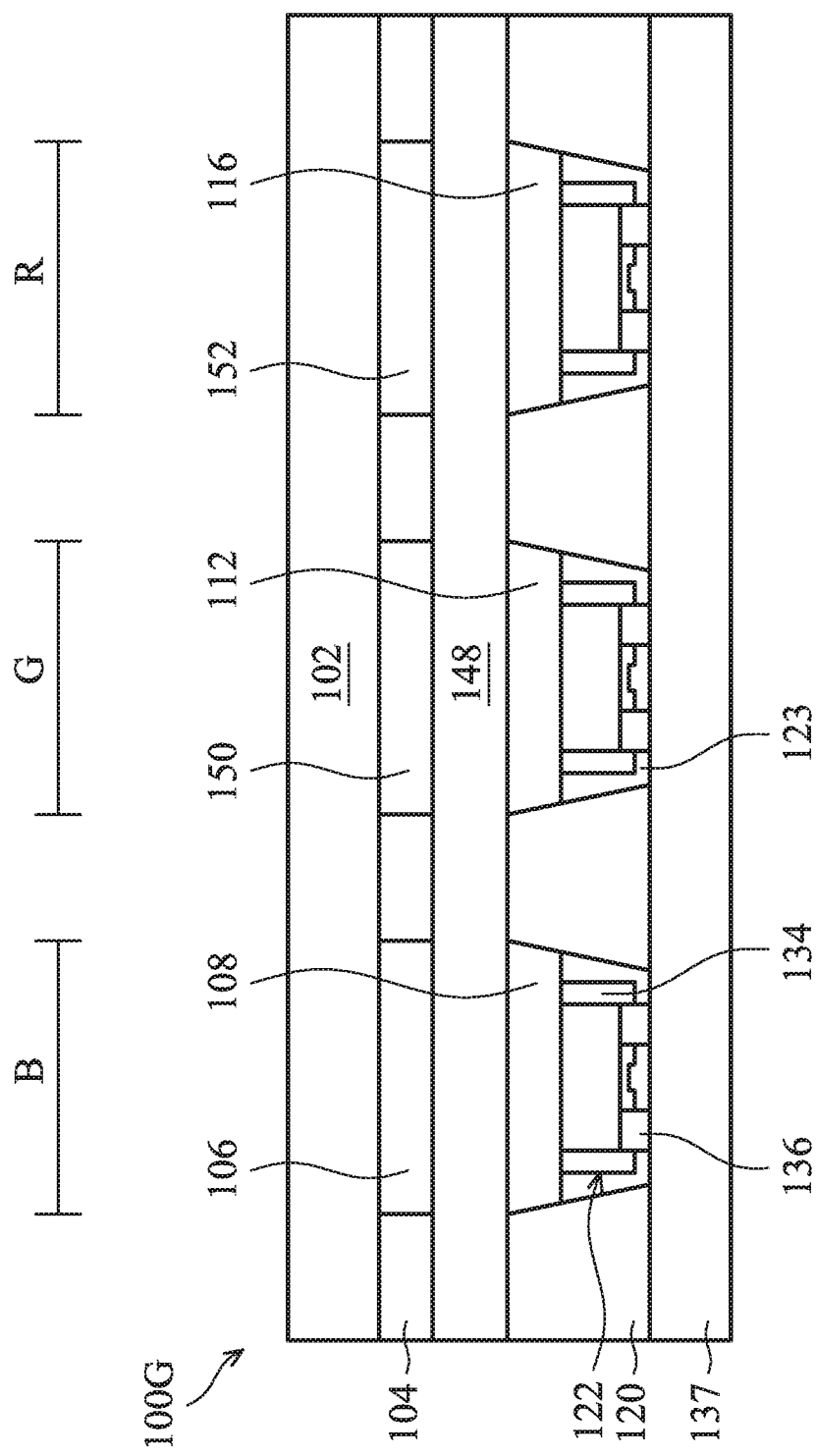

Many variations and/or modifications can be made to embodiments of the disclosure. Referring to FIG. 10, FIG. 10 is a cross-sectional view of a display device 100G in accordance with some embodiments of the present disclosure. The display device 100G may be similar to the display device 100F, and one of the differences is that the yellow light filter layer 110 disposed in the green pixel G is replaced with the green light filter layer 150, and the yellow light filter layer 114 disposed in the red pixel R is replaced with the red light filter layer 152.

Many variations and/or modifications can be made to embodiments of the disclosure. In some embodiments, the blue color conversion layer 108 shown in FIG. 10 can be replaced with the filling layer 138 shown in FIG. 4. In this embodiment, the portion of the dielectric layer 148 corresponding to the blue pixel B is not formed. Namely, the dielectric layer 148 is disposed in the corresponding green pixel G and the red pixel R. In some embodiments, the material of the filling layer 138 is the same as or similar to that of the dielectric layer 148. In some embodiments, the refractive index of the material of the filling layer 138 is different from the refractive index of the material of the dielectric layer 148. In some embodiments, the light shielding layer 120 and the light-emitting diode 122 (which includes all the elements of the light-emitting diode 122 shown in FIG. 2) shown in FIG. 10 can be replaced with the liquid-crystal display element 140 shown in FIG. 6.

Figure 11:
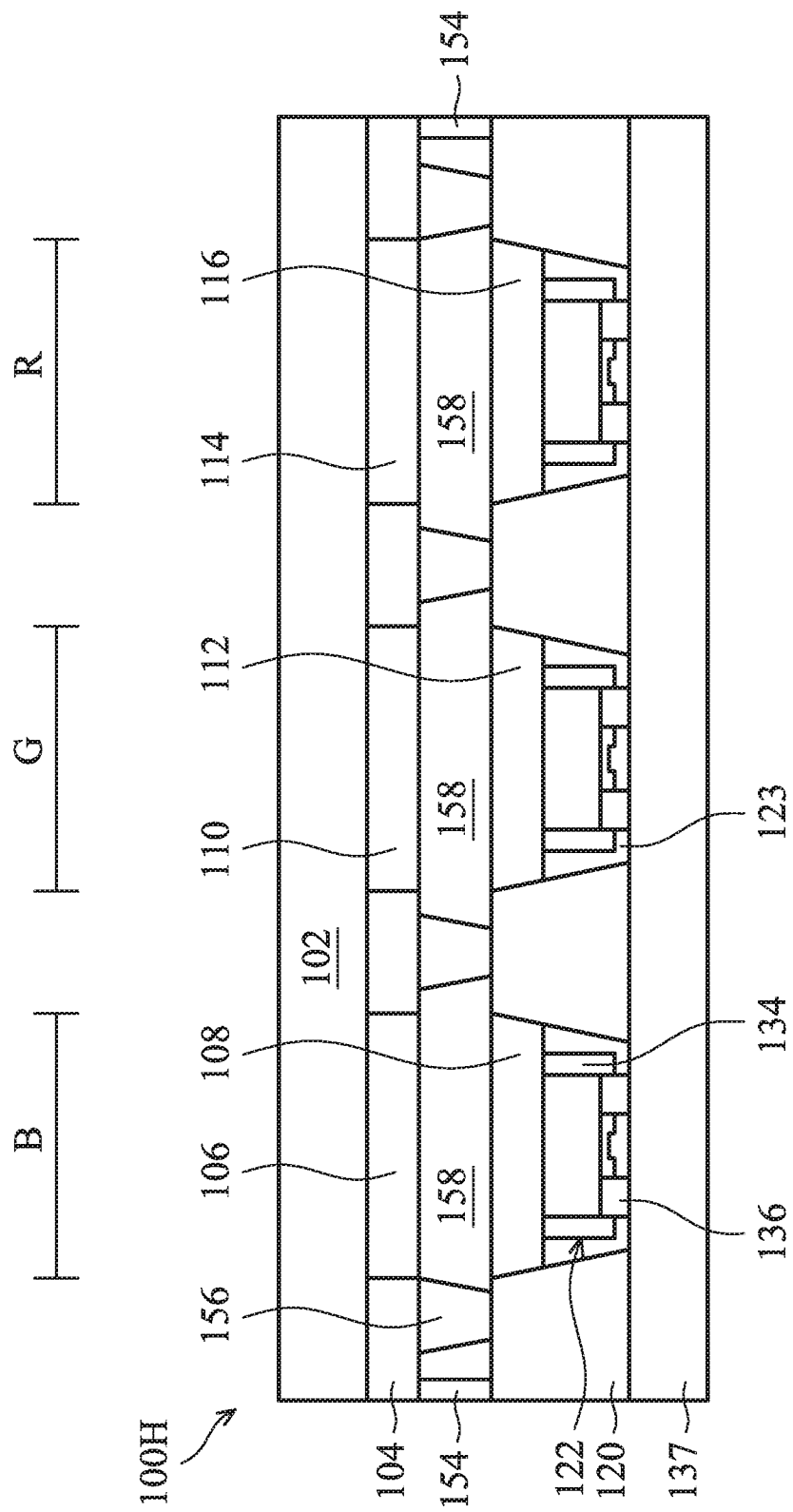

Many variations and/or modifications can be made to embodiments of the disclosure. Referring to FIG. 11, FIG. 11 is a cross-sectional view of a display device 100H in accordance with some embodiments of the present disclosure. The display device 100H may be similar to the display device 100G, and one of the differences is that the dielectric layer 148 is replaced with a spacer element 156 and air (or a vacuum layer) 158. In other embodiments, the dielectric layer 148 is replaced with the spacer element 156 and the air 158 and a spacer layer 154. As shown in FIG. 11, the spacer element 156 is disposed between the light shielding layer 104 and the light shielding layer 120. The spacer element 156 may be a spacer controlling material (e.g. photo spacer). In addition, the spacer element 156 may include, but is not limited to, glass, ceramic, plastic, other transparent or non-transparent material. In some embodiments, the material of the spacer element 156 is the same as or similar to the material of the light shielding layer 104. In some embodiments, the spacer element 156 substantially overlaps the light shielding layer 104 or the light shielding layer 120 along a normal direction of the substrate 102. In some embodiments, the cross-sectional shape of spacer element 156 is, but is not limited to, trapezoidal, circular, arc-shaped, rectangular or square. The spacer layer 154 (such as frame layer) is disposed outside of the spacer element 156 and used to separate or package the blue pixel B, the green pixel G and the red pixel R. the light shielding layer 104 and the light shielding layer 120 may be used to shield the elements or region which is not used to display colors in the display device 100H. For example, the light shielding layer 104 and the light shielding layer 120 may be used to shield the data lines (not shown), scan lines (not shown) and TFTs (not shown).

In addition, the display device 100H further includes the air 158 between the color conversion layer (e.g. the blue light filter layer 106, the yellow light filter layer 110 and the yellow light filter layer 114) and the light filter layer (e.g. the blue color conversion layer 108, the green color conversion layer 112 and the red color conversion layer 116), wherein the air 158 has lower refractive index (the refractive index of the air 158 is about 1), the possibility of excitation of light returning to the color conversion layer is enhanced. In addition, the material with the lower refractive index can be omitted so that the cost is reduced, or the process is simplified.

Many variations and/or modifications can be made to embodiments of the disclosure. In some embodiments, the blue color conversion layer 108 shown in FIG. 11 can be replaced with the filling layer 138 shown in FIG. 4. In some embodiments, the light shielding layer 120 and the light-emitting diode 122 (which includes all the elements of the light-emitting diode 122 shown in FIG. 2) shown in FIG. 11 can be replaced with the liquid-crystal display element 140 shown in FIG. 6.

Figure 12:
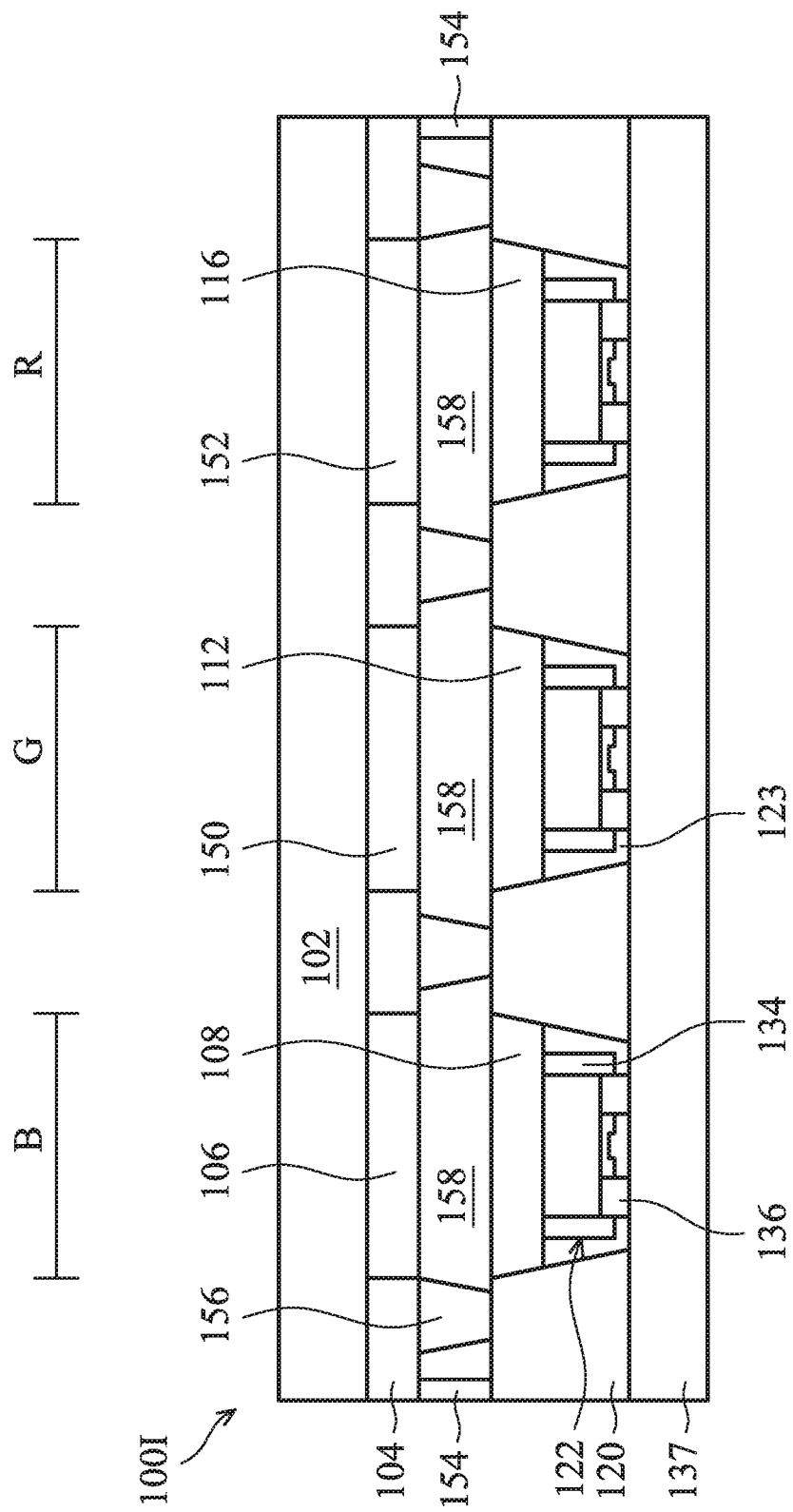

Many variations and/or modifications can be made to embodiments of the disclosure. Referring to FIG. 12, FIG. 12 is a cross-sectional view of a display device 100I in accordance with some embodiments of the present disclosure. The display device 100I may be similar to the display device 100H, and one of the differences is that the yellow light filter layer 110 disposed in the green pixel G is replaced with the green light filter layer 150, and the yellow light filter layer 114 disposed in the red pixel R is replaced with the red light filter layer 152.

Many variations and/or modifications can be made to embodiments of the disclosure. In some embodiments, the blue color conversion layer 108 shown in FIG. 12 can be replaced with the filling layer 138 shown in FIG. 4. In some embodiments, the light shielding layer 120 and the light-emitting diode 122 (which includes all the elements of the light-emitting diode 122 shown in FIG. 2) shown in FIG. 12 can be replaced with the liquid-crystal display element 140 shown in FIG. 6.

Figure 13:
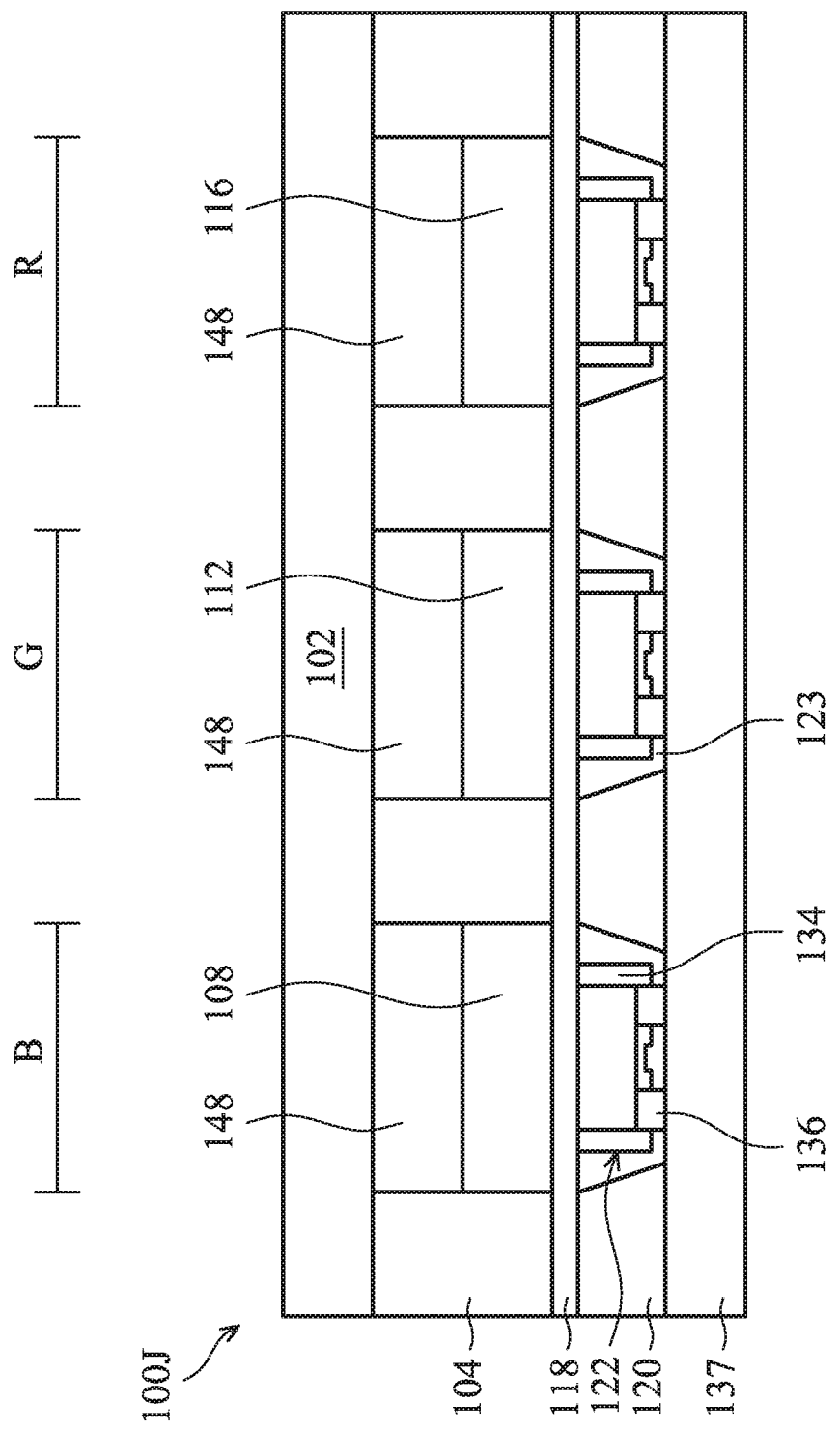

Many variations and/or modifications can be made to embodiments of the disclosure. Referring to FIG. 13, FIG. 13 is a cross-sectional view of a display device 100J in accordance with some embodiments of the present disclosure. The display device 100J may be similar to the display device 100D, and one of the differences is that the light filter layers are not formed in the corresponding blue pixel B, the green pixel G and the red pixel R. In this embodiment, the dielectric layer 148 is in direct contact with the substrate 102.

Many variations and/or modifications can be made to embodiments of the disclosure. In some embodiments, the blue color conversion layer 108 shown in FIG. 13 can be replaced with the filling layer 138 shown in FIG. 4. In some embodiments, the light shielding layer 120 and the light-emitting diode 122 (which includes all the elements of the light-emitting diode 122 shown in FIG. 2) shown in FIG. 13 can be replaced with the liquid-crystal display element 140 shown in FIG. 6.

Figure 14:
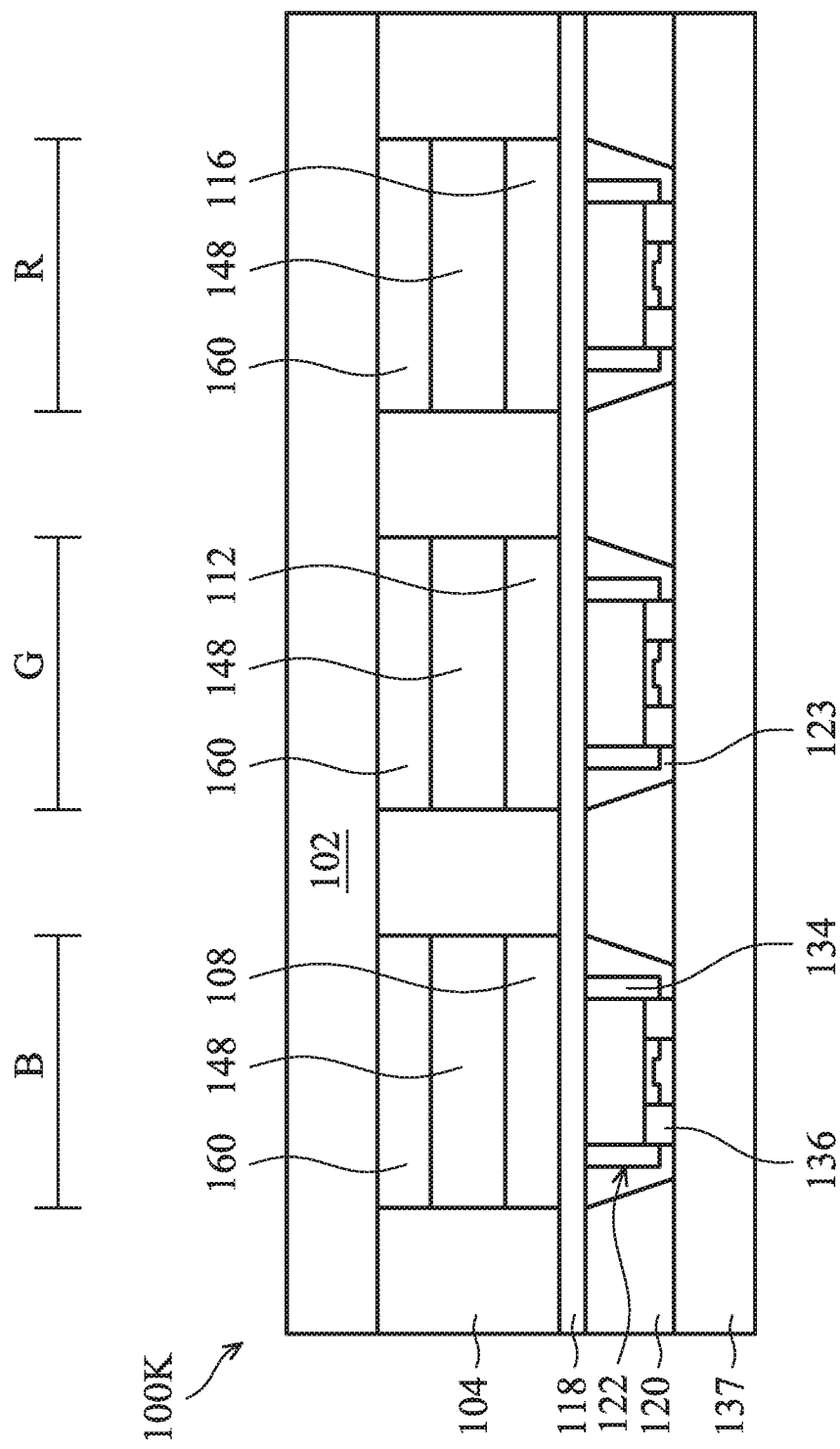

Many variations and/or modifications can be made to embodiments of the disclosure. Referring to FIG. 14, FIG. 14 is a cross-sectional view of a display device 100K in accordance with some embodiments of the present disclosure. The display device 100K may be similar to the display device 100D, and one of the differences is that the blue light filter layer 106, the yellow light filter layer 110 and the yellow light filter layer 114 are replaced with a short wavelength filter layer 160. The short wavelength filter layer 160 may shield wavelength of light shorter than 430 nm, so a transmittance of light (wavelength shorter than 430 nm) through the short wavelength filter layer 160 is less than 5%. Namely, when light is converted to the color of blue light, green light, and red light through the blue color conversion layer 108, the green color conversion layer 112 and the red color conversion layer 116, respectively, these different color of lights further penetrate the short wavelength filter layer 160 to filter out wavelength of light shorter than 430 nm (e.g. ultraviolet or near ultraviolet).

In some embodiments, the short wavelength filter layer 160 can be replaced with distributed Bragg reflector (DBR). The material of DBR includes, but is not limited to, a nonmetal material, a dielectric material, an optical fiber or other materials. DBR may be made of multi-layers of films with different refractive index, and DBR can be used as a waveguide.

Many variations and/or modifications can be made to embodiments of the disclosure. In some embodiments, the blue color conversion layer 108 shown in FIG. 14 can be replaced with the filling layer 138 shown in FIG. 4. In some embodiments, the light shielding layer 120 and the light-emitting diode 122 (which includes all the elements of the light-emitting diode 122 shown in FIG. 2) shown in FIG. 14 can be replaced with the liquid-crystal display element 140 shown in FIG. 6.

Figure 15:
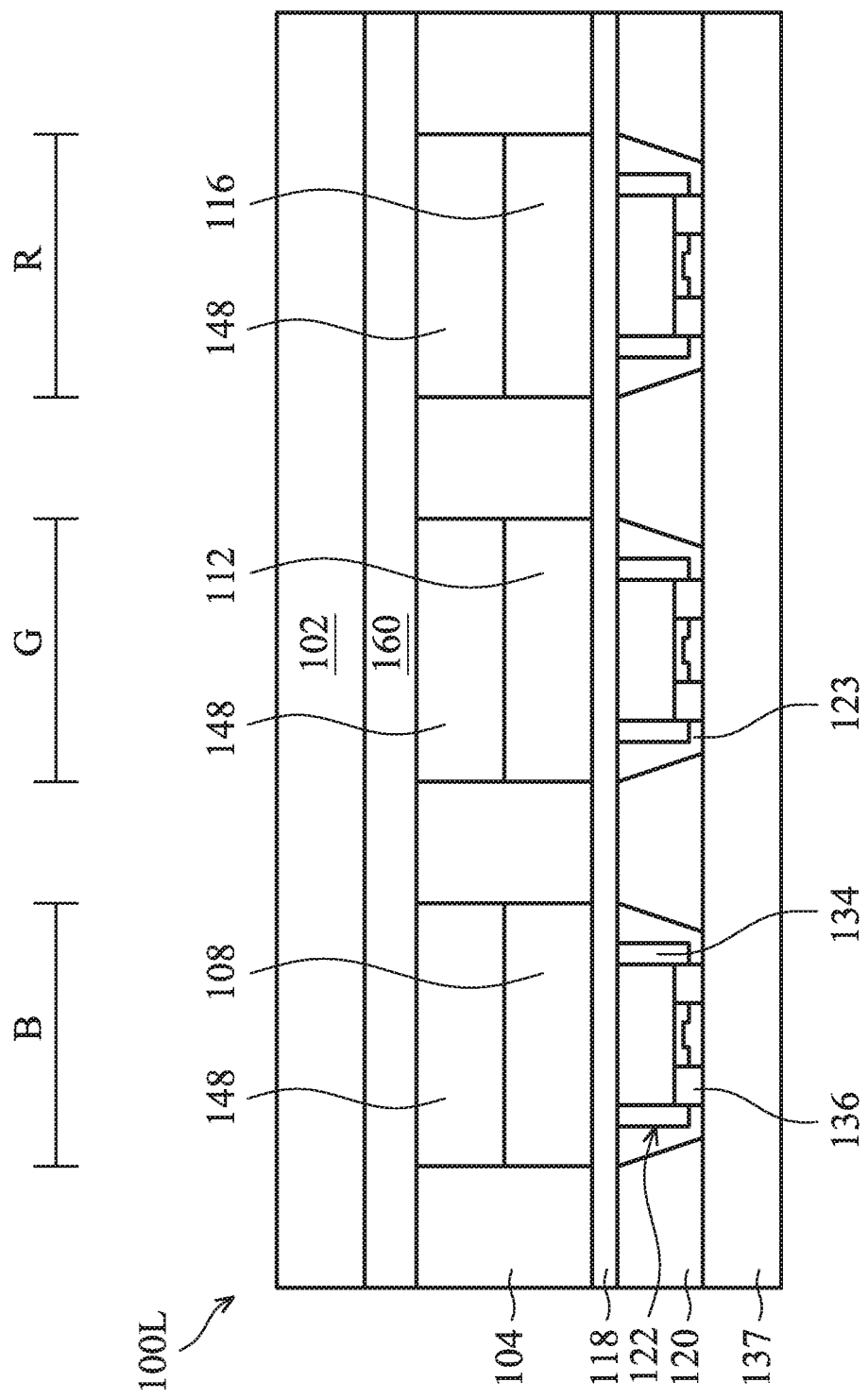

Many variations and/or modifications can be made to embodiments of the disclosure. Referring to FIG. 15, FIG. 15 is a cross-sectional view of a display device 100L in accordance with some embodiments of the present disclosure. The display device 100L may be similar to the display device 100K, and one of the differences is that the short wavelength filter layer 160 is disposed on the light shielding layer 104, and between the light shielding layer 104 and the substrate 102. In this embodiment, the short wavelength filter layer 160 is disposed over the light shielding layer 104 and the dielectric layer 148.

Many variations and/or modifications can be made to embodiments of the disclosure. In some embodiments, the blue color conversion layer 108 shown in FIG. 15 can be replaced with the filling layer 138 shown in FIG. 4. In some embodiments, the light shielding layer 120 and the light-emitting diode 122 (which includes all the elements of the light-emitting diode 122 shown in FIG. 2) shown in FIG. 15 can be replaced with the liquid-crystal display element 140 shown in FIG. 6.

Figure 16:
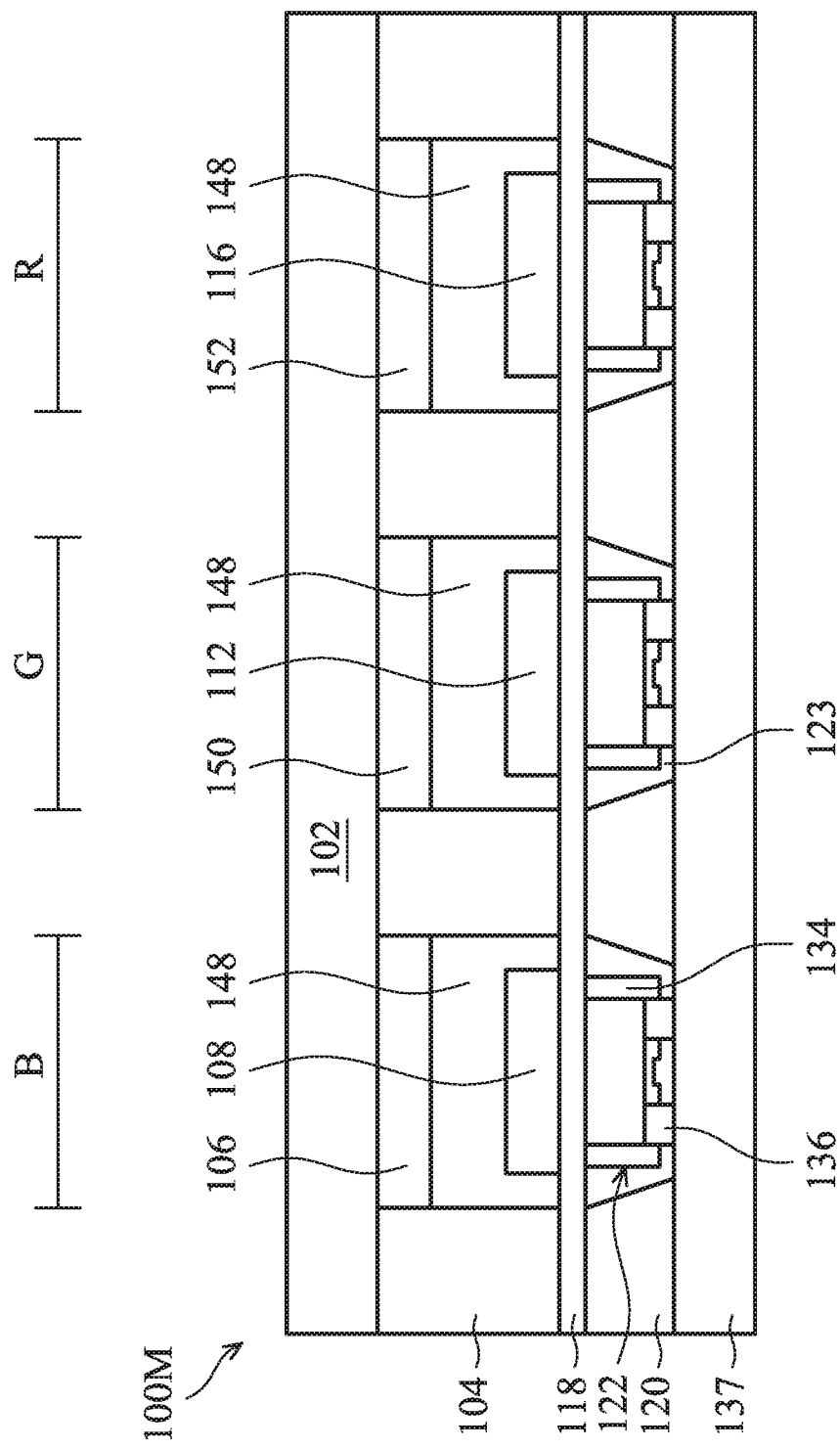

Many variations and/or modifications can be made to embodiments of the disclosure. Referring to FIG. 16, FIG. 16 is a cross-sectional view of a display device 100M in accordance with some embodiments of the present disclosure. The display device 100M may be similar to the display device 100E, and one of the differences is that the color conversion layer (e.g. the blue color conversion layer 108, the green color conversion layer 112 and the red color conversion layer 116) is covered by the dielectric layer 148. As shown in FIG. 16, the dielectric layer 148 is further disposed on sidewalls of the blue color conversion layer 108, the green color conversion layer 112 or the red color conversion layer 116. Namely, the area of the dielectric layer 148 projecting onto the substrate 102 of display device is greater than the area of the blue color conversion layer 108, the green color conversion layer 112 and the red color conversion layer 116 projecting onto the substrate 102 along the normal direction of the substrate 102 respectively. In other words, the blue color conversion layer 108, the green color conversion layer 112 and the red color conversion layer 116 is covered by the dielectric layers 148 respectively, and the dielectric layers 148 can be in contact with two side surface of color conversion layers (such as the blue color conversion layer 108, the green color conversion layer 112 and the red color conversion layer 116) respectively, for example. Because of larger contacting area between the dielectric layer 148 and the blue color conversion layer 108, the green color conversion layer 112 and the red color conversion layer 116, the possibility of excitation of light returning to the color conversion layer is enhanced.

Many variations and/or modifications can be made to embodiments of the disclosure. In some embodiments, the blue color conversion layer 108 shown in FIG. 16 can be replaced with the filling layer 138 shown in FIG. 4.

Figure 17:
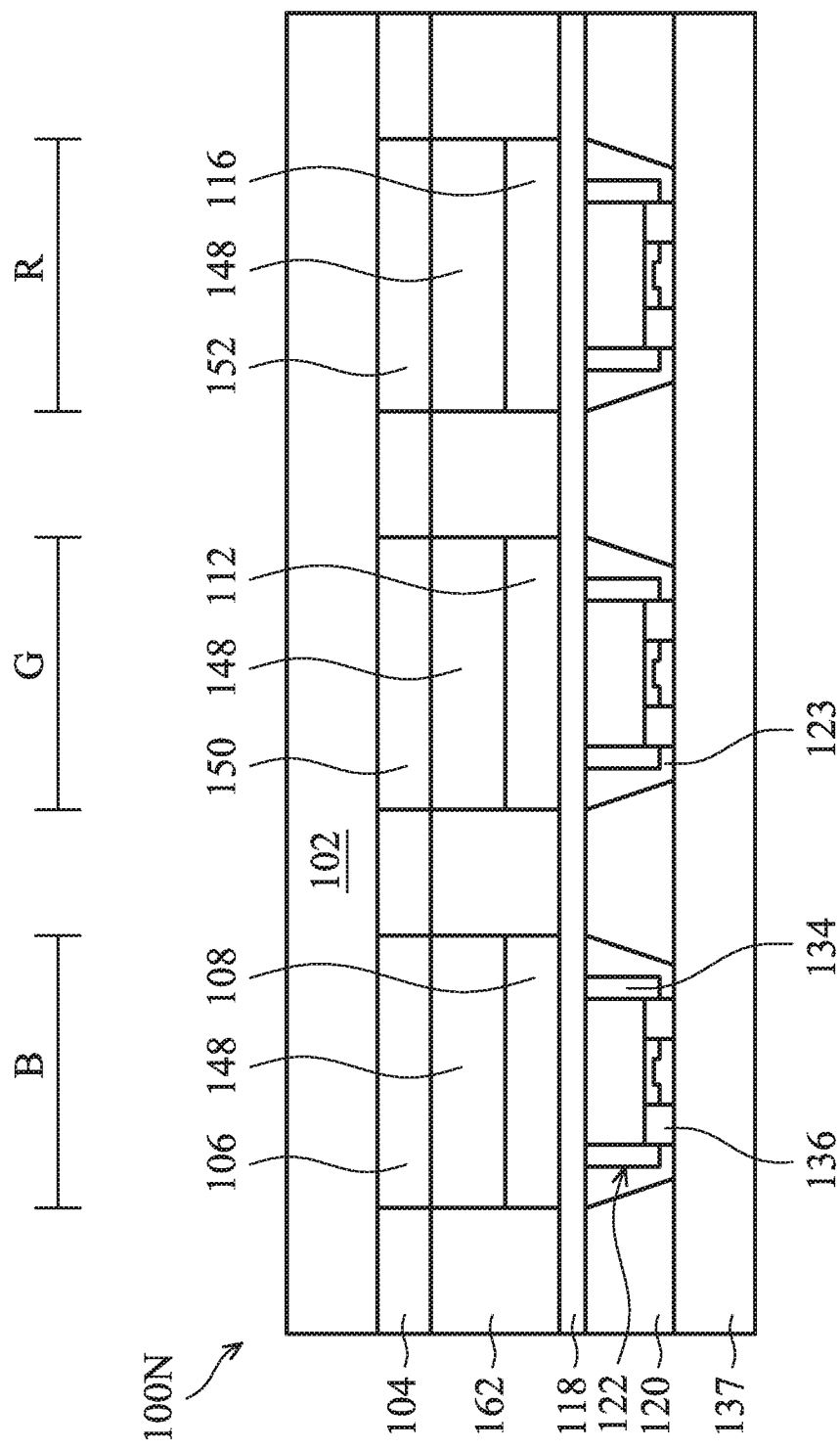

Many variations and/or modifications can be made to embodiments of the disclosure. Referring to FIG. 17, FIG. 17 is a cross-sectional view of a display device 100N in accordance with some embodiments of the present disclosure. The display device 100N may be similar to the display device 100E, and one of the differences is that the display device 100N further includes a total reflection layer 162 disposed between the light shielding layer 104 and the adhesive layer 118. As shown in FIG. 17, the total reflection layer 162 completely or partially overlaps the light shielding layer 104 and the light shielding layer 120 along the normal direction of the substrate 102. The material of the total reflection layer 162 includes, but is not limited to, metal (e.g. Al, Ag, Cu, Ti, other metal, or metal alloy), nonmetal, dielectric material or white photoresist. In some embodiments, the material of the total reflection layer 162 includes, but is not limited to, dielectric materials such as $SiO_2$ or $TiO_2$. The refractive index of the total reflection layer 162 may be adjusted in accordance with the process condition or the composition of the material, and the scope of disclosure is not intended to be limiting.

Many variations and/or modifications can be made to embodiments of the disclosure. In some embodiments, the blue color conversion layer 108 shown in FIG. 17 can be replaced with the filling layer 138 shown in FIG. 4.

Figure 18A:
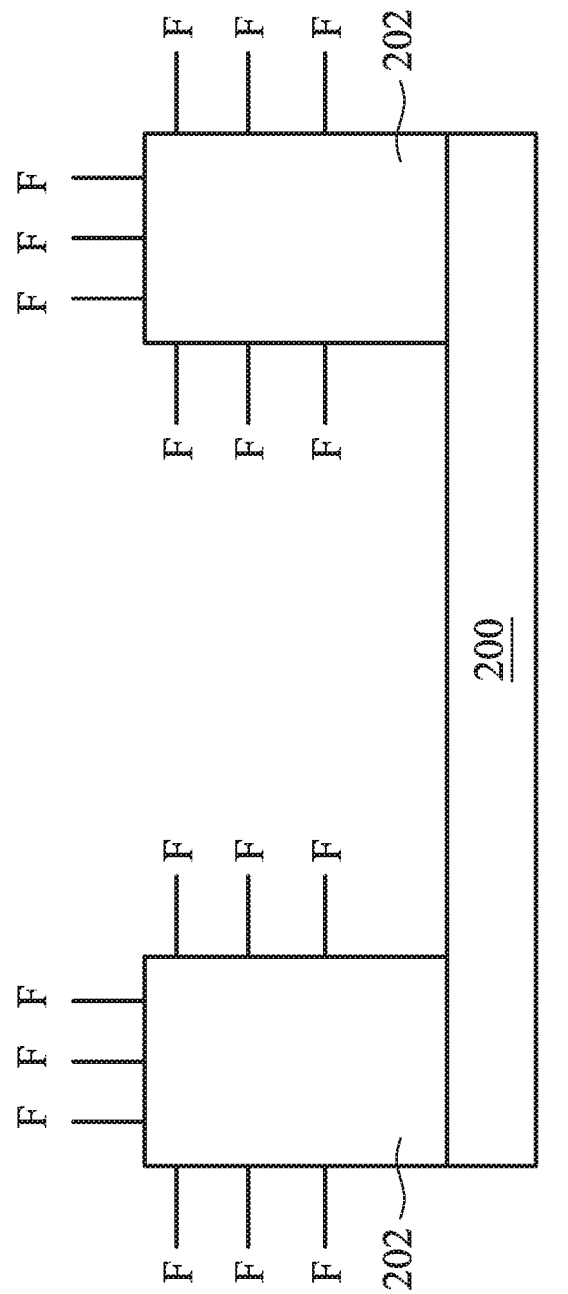
FIGS. 18A and 18B are cross-sectional views of a process for forming a layer film between the spacer layers in accordance with some embodiments of the present disclosure.
Figure 18B:
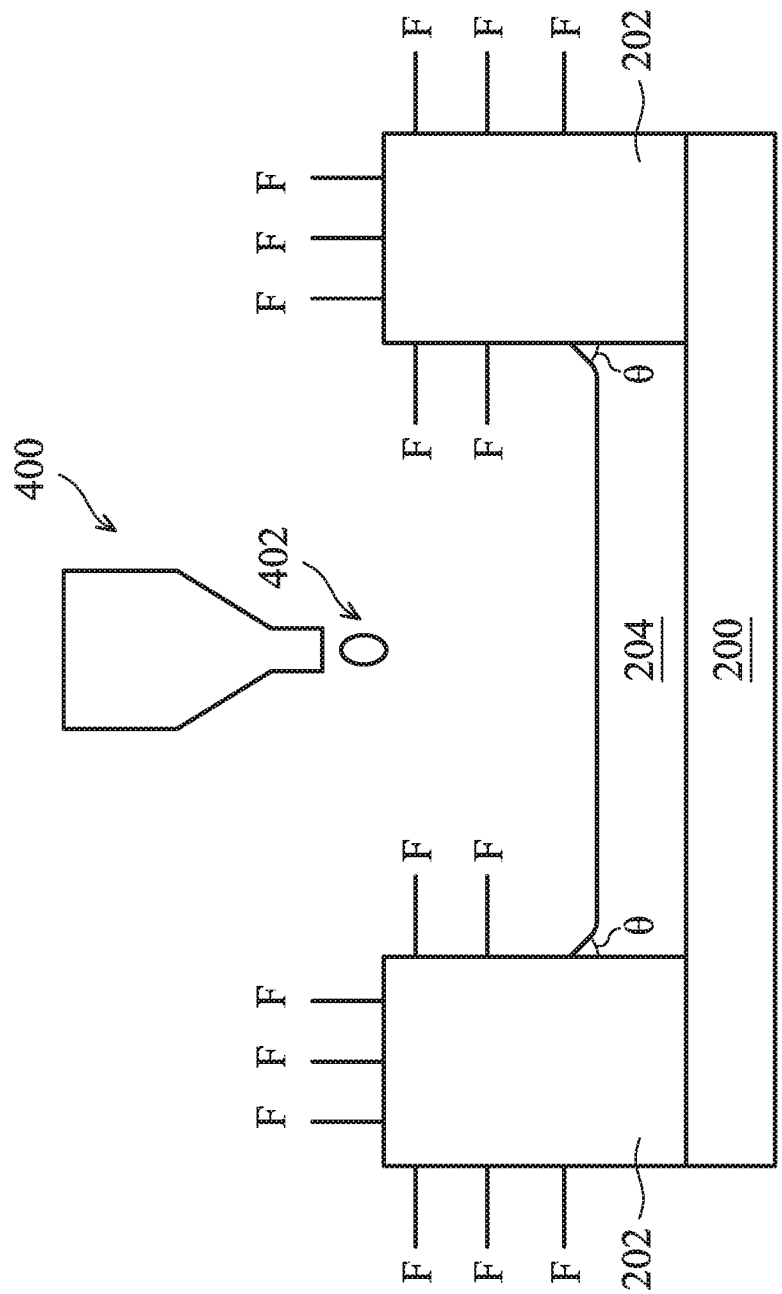

Referring to FIGS. 18A and 18B, FIGS. 18A and 18B are cross-sectional views of a process for forming a material layer 204 between the spacer layers 202 in accordance with some embodiments of the present disclosure. When an inkjet printing process is performed, there is a problem of non-uniform thickness of the material layer formed by inkjet printing process due to different surface tension of the sprayed material between two surfaces of different material. In some cases, the middle portion of the material layer protrudes, and two side portions of the material layer dent. In other cases, the middle portion of the material layer dents, and two side portions of the material layer protrude. In order to solve the issue of non-uniform thickness of the material layer, a modification is performed on the material being in contact with the sprayed material. As a result, the contact angle between the sprayed material and the material being contact with it can be controlled in a suitable range. Therefore, the uniformity of the sprayed material is enhanced. In some embodiments, the material of the spacer layer 202 has a contact angle to water in a range of about 90° to about 150°. In some embodiments, the spacer layer 202 (such as the shielding layer) contains fluorine elements or function groups with fluorine (F). In some embodiments, the surface or entire of the spacer layer 202 contains fluorine (F) elements or function groups with fluorine (F). In some embodiments, the spacer layer 202 is a polymer added with fluorine (F) element, and therefore the spacer layer 202 forms a polymer material containing fluorine (F). In other embodiment, the surface or entire of the spacer layer 202 contains other suitable elements so that the spacer layer 202 has a contact angle to water in a range of about 90° to about 150°. The "contact angle to water" can be measured by dropping a water drop on the spacer layer 202 and subsequently using a contact angle meter to measure the contact angle between the spacer layer 202 and the water drop.

In some embodiments, as shown in FIG. 18A, a substrate 200 is provided. The substrate 200 may such as a board, an element or a structure layer. When the substrate 200 is the board, the substrate 200 may include a glass board, a ceramic board, a plastic board or another applicable transparent board.

As shown in FIG. 18A, the spacer layer 202 is formed on the substrate 200. Since the surface or entire of the spacer layer 202 has fluorine (F) elements or functional groups containing fluorine (F), the surface of the spacer layer 202 is hydrophobic. As a result, the contact angle between the surface of the spacer layer 202 and the sprayed material varies according to the change of the surface tension between the surface of the spacer layer 202 and the sprayed material. In this embodiment, the contact angle means that the angle between the spacer layer 202 and the sprayed material, the sprayed material is not baked or dealt with by subsequent process. In some embodiments, the contact angle between the spacer layer 202 and the sprayed material changes when the spacer layer 202 is baked or dealt with by subsequent process, and the scope of disclosure is not intended to be limiting.

When the surface or the entire of the spacer layer 202 is modified, the contact angle between the spacer layer 202 and solvent (such as water) is changed. For example, when there is no fluorine (F) element or functional group containing fluorine (F) on the surface or entire of the spacer layer 202, the contact angle between the surface of the spacer layer 202 and water is within a range of about 0° to about 80°. In some embodiments, when there are fluorine (F) elements or functional groups containing fluorine (F) on the surface or entire of the spacer layer 202, the contact angle between the surface of the spacer layer 202 and water is within a range of about 90° to about 150°.

After the modification of the surface or entire of the spacer layer 202, the spacer layer 202 has a contact angle to water in a range of about 90° to about 150°. As a result, the uniformity of the thickness of the material layer formed on the substrate 200 and between two adjacent spacer layers 202 is enhanced by inkjet printing process.

In some embodiments, referring to FIG. 18B, when the inkjet process is performed, a sprayed material 402 is sprayed to the substrate 200 by a nozzle 400 so that the material layer 204 is formed on the substrate 200 between two adjacent spacer layers 202. As shown in FIG. 18B, when the surface or entire of the spacer layer 202 is modified, the contact angle θ between the spacer layer 202 and the material layer 204 is adjusted. The material layer 204 has a planar surface.

In some embodiments, the spacer layer 202 may be, but is not limited to, such as the light shielding layer 104 or the total reflection layer 162 shown in the embodiments illustrated in FIGS. 1-17. The material layer 204 may be, but is not limited to, such as the blue light filter layer 106, the blue color conversion layer 108, the yellow light filter layer 110, the green color conversion layer 112, the yellow light filter layer 114, the red color conversion layer 116, the dielectric layer 148, the green light filter layer 150 or the red light filter layer 152 shown in the embodiments illustrated in FIGS. 1-17. In some embodiments, when it is necessary to form the color conversion layer after formation of the dielectric layer, the dielectric layer can be regarded as another material which is in contact with the sprayed material (e.g. the color conversion layer).

Figure 19A:
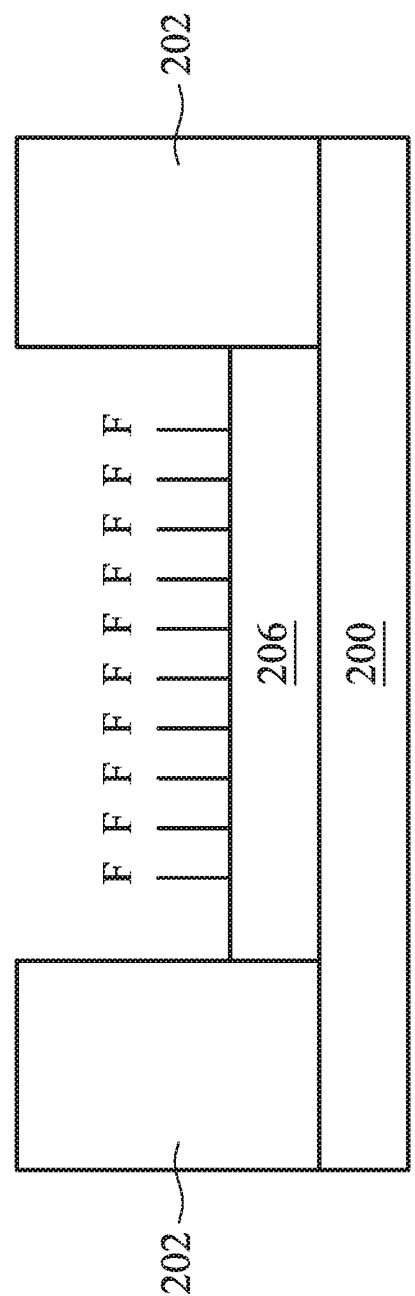
FIGS. 19A-19C are cross-sectional views of a process for forming a material layer between the spacer layers in accordance with some embodiments of the present disclosure.
Figure 19B:
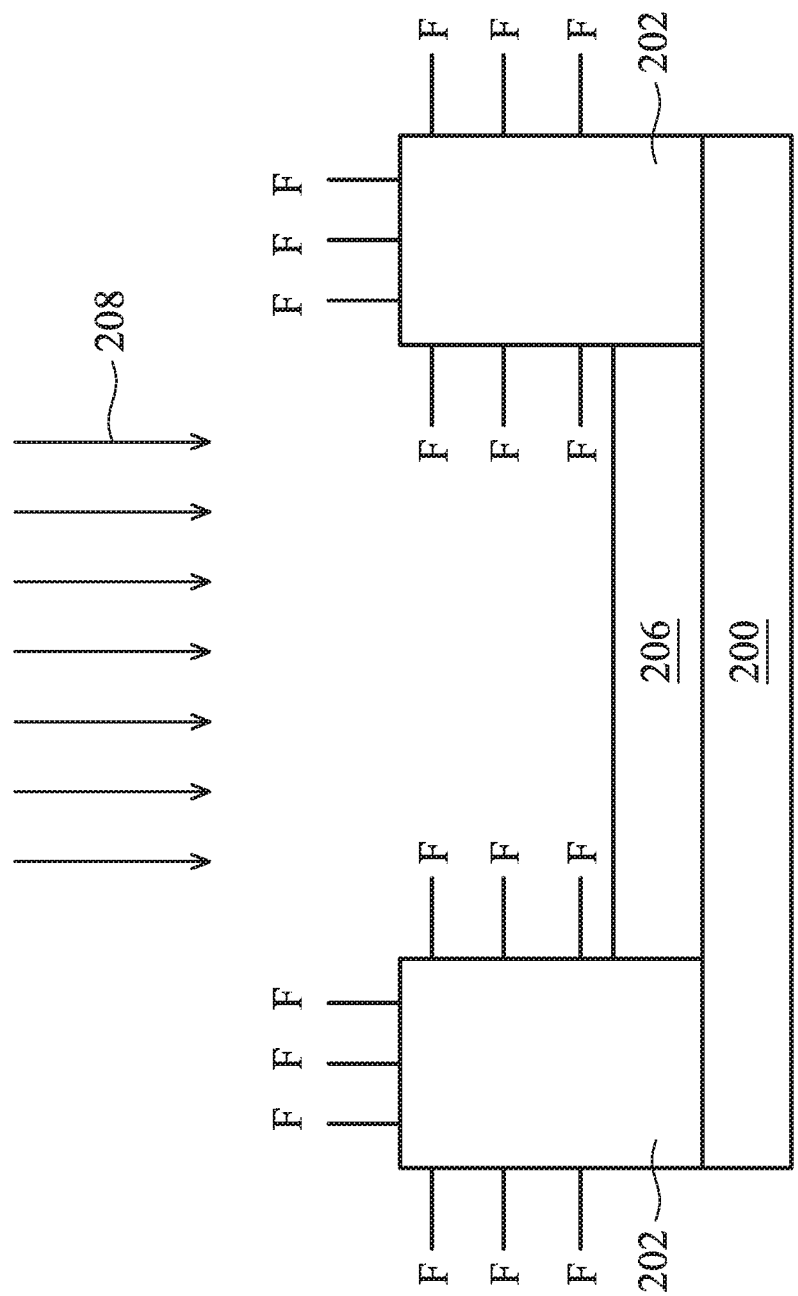
Figure 19C:
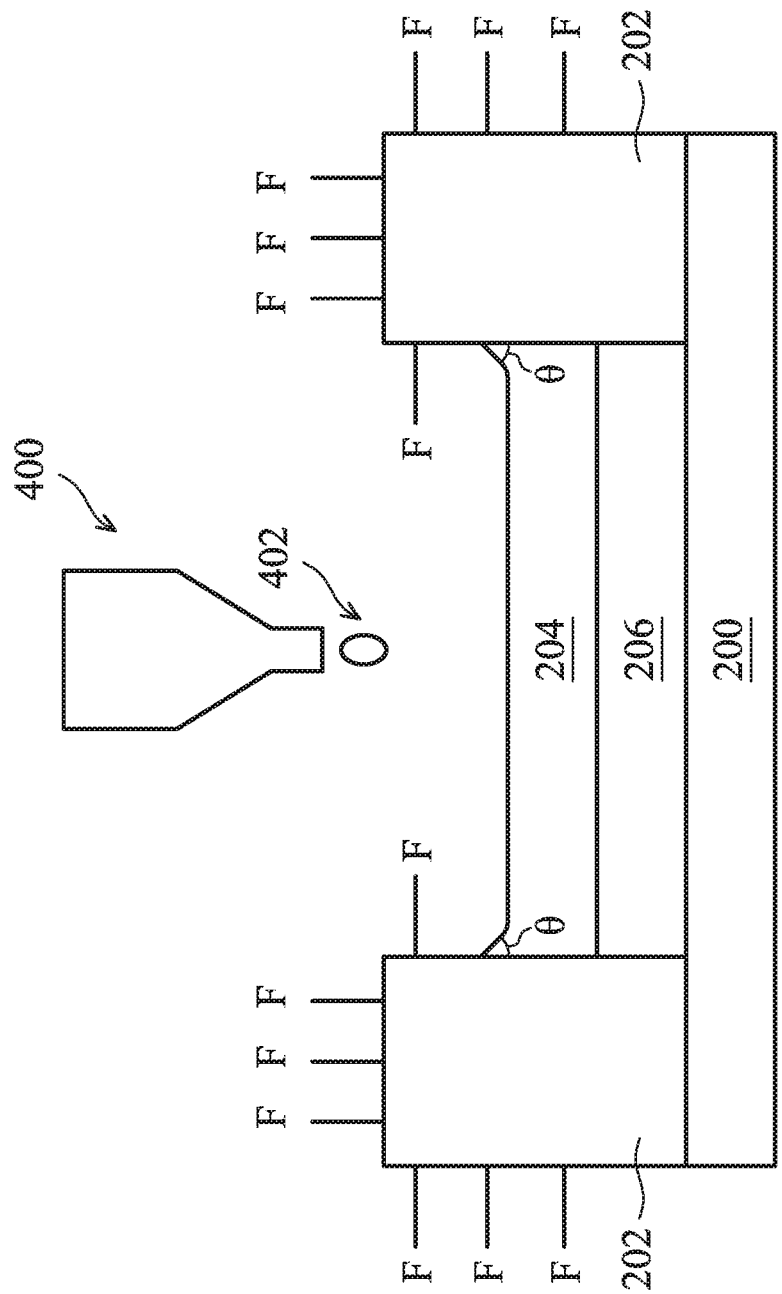

Referring to FIGS. 19A-19C, FIGS. 19A-19C are cross-sectional views of a process for forming the material layer 204 between the spacer layers 202 in accordance with some embodiments of the present disclosure. As shown in FIG. 19A, a surface of a spacer layer 202 does not contain fluorine (F), the spacer layer 202 is formed on the substrate 200. Next, a bottom surface of a bottom layer 206 contains fluorine (F), bottom layer 206 is formed on the substrate 200 and between two adjacent spacer layers 202. The bottom layer 206 may be, but is not limited to, a substrate of the display device can contain fluorine (F), or a surface of the substrate of the display device contains a dielectric material with fluorine (F).

Next, in some embodiments, a plasma process 208 is performed on an entire structure containing the spacer layer 202 and the bottom layer 206 shown in FIG. 19B. In some embodiments, the plasma process 208 includes, but is not limited to, implanting $CF_4$, $CH_3F$, $CH_2F_2$, other gas containing fluorine (F) or materials with suitable elements. As shown in FIG. 19B, after the plasma process 208 is performed, fluorine (F) elements or functional groups on the surface of the bottom layer 206 are transferred to the surface (e.g. top surface or side surface) of the spacer layer 202.

In some embodiments, referring to FIG. 19C, the inkjet process is performed, and the sprayed material 402 is sprayed or coated on the substrate 200 through the nozzle 400. As a result, the material layer 204 is formed on the bottom layer 206 and two adjacent spacer layers 202.

In some embodiments, the spacer layer 202 may be, but is not limited to, such as the light shielding layer 104 or the total reflection layer 162 shown in the embodiments illustrated in FIGS. 1-17. The bottom layer 206 may be, but is not limited to, a blue light filter layer 106, a yellow light filter layer 110, a yellow light filter layer 114, a dielectric layer 148, a green light filter layer 150 or a red light filter layer 152, as shown in the embodiments illustrated in FIGS. 1-17. The material layer 204 may be, but is not limited to, such as the blue color conversion layer 108, the green color conversion layer 112 or the red color conversion layer 116 shown in the embodiments illustrated in FIGS. 1-17 in accordance with the sequence of manufacturing.

In this embodiment, a color conversion layer, a light filter layer, or a dielectric layer, which the surface contains fluorine (F), and fluorine (F) may transfer from the color conversion layer, the light filter layer, or the dielectric layer to the surface of the light shielding layer 104 or the total reflection layer 162 by a plasma process.

Figure 20A:
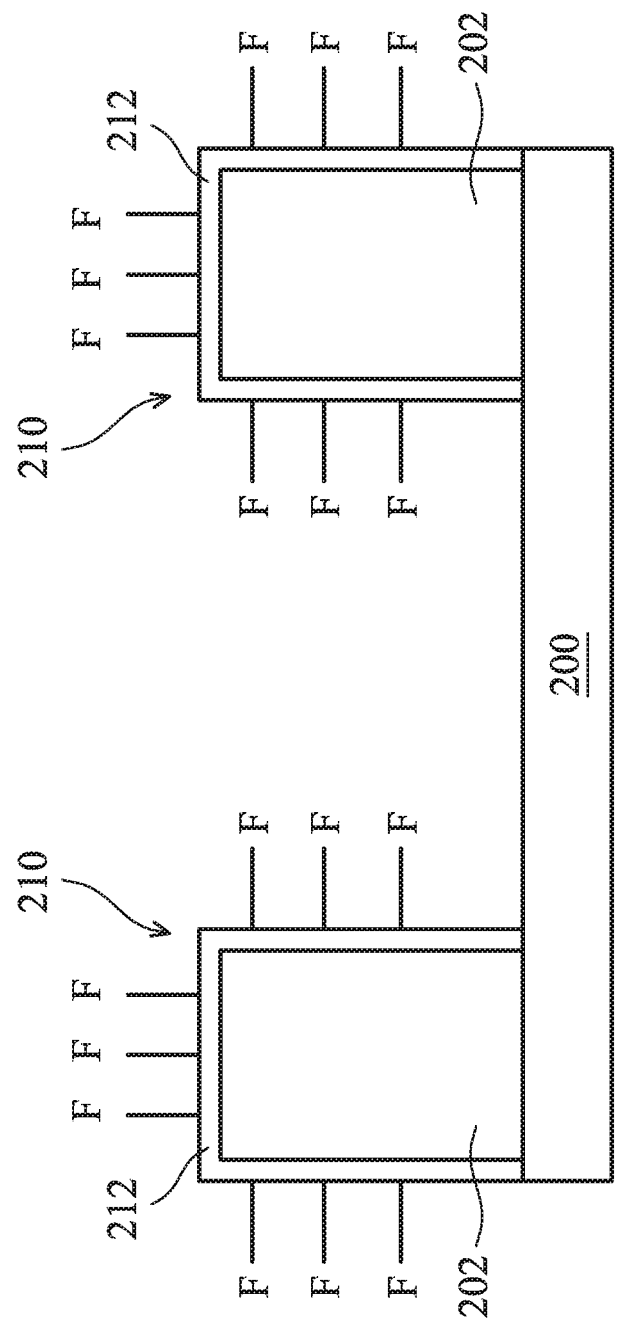
FIGS. 20A and 20B are cross-sectional views of a process for forming a material layer between the spacer layers in accordance with some embodiments of the present disclosure.
Figure 20B:
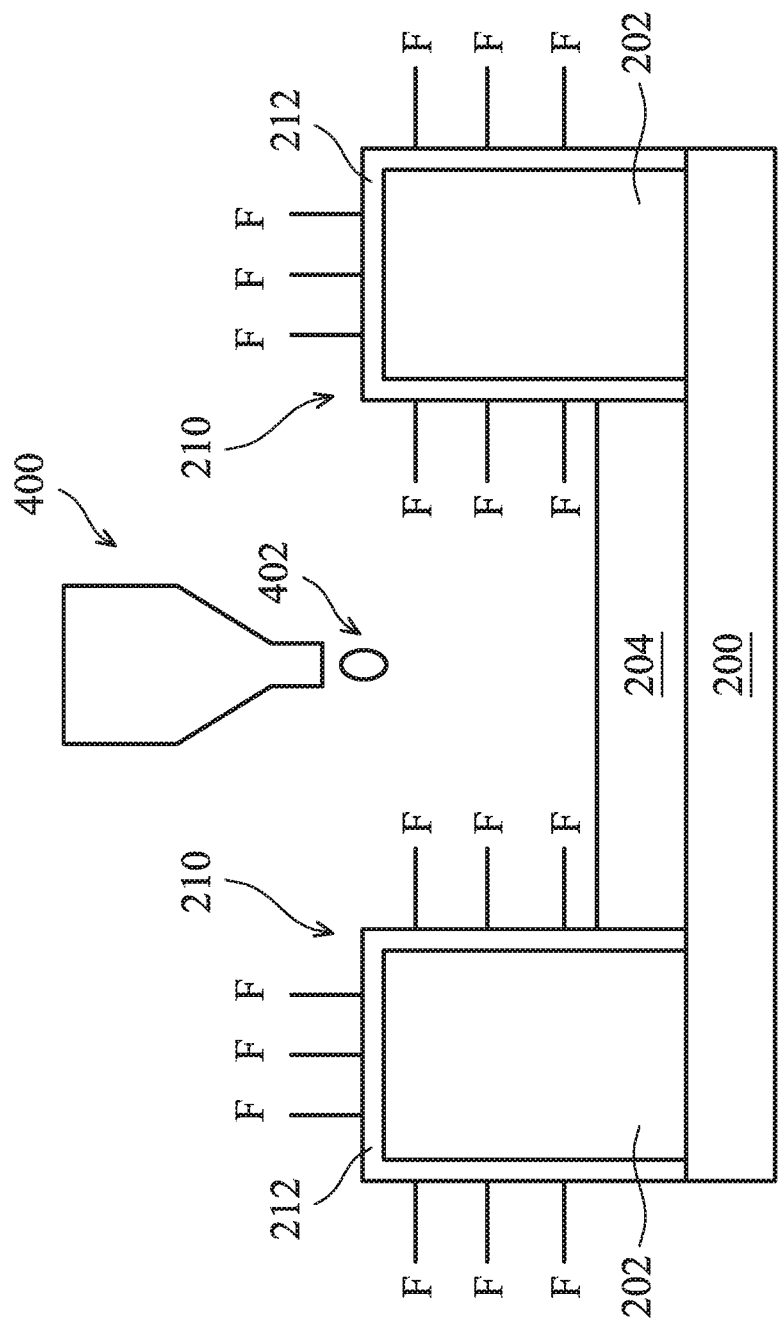

Referring to FIGS. 20A-20B, FIGS. 20A-20B are cross-sectional views of a process for forming the material layer 204 between the spacer layers 202 in accordance with some embodiments of the present disclosure. As shown in FIG. 20A, the surface of the spacer layer 202 does not contain fluorine (F), the spacer layer 202 is formed on the substrate 200. Next, a coating layer 212 is formed on top surface of the spacer layer 202 or side surfaces of the spacer layer 202. In some embodiments, the surface of the coating layer 212 is a polymer material with fluorine (F), and the spacer layer 202 is a monomer or polymer material without fluorine (F). After the formation of the coating layer 212, the outer surfaces of the spacer layer 202 contain fluorine (F) by bonding between the coating layer 212 and the spacer layer 202, and the scope of disclosure is not intended to be limiting.

As mentioned above, the spacer layer 202 reacts or bonds with the coating layer 212 to form a spacer structure 210. The contact angle between the spacer structure 210 and solvent can be adjusted by forming a coating layer 212, the surface of the coating layer 212 contains fluorine (F), on the spacer layer 202 to form the spacer structure 210. In some embodiments, the contact angle between the spacer structure 210 and water is within a range of about 90° to about 150°.

In some embodiments, referring to FIG. 20B, the inkjet process is performed, and the sprayed material 402 is sprayed on the substrate 200 through the nozzle 400. As a result, the material layer 204 is formed on the substrate 200 and two adjacent spacer layers 202.

In some embodiments, the light shielding layer 104, the total reflection layer 162 or a combination thereof shown in the embodiments illustrated in FIGS. 1-17 form the spacer structure which contains fluorine (F) on its surface. The material layer 204 may be, but is not limited to, such as the blue light filter layer 106, the blue color conversion layer 108, the yellow light filter layer 110, the green color conversion layer 112, the yellow light filter layer 114, the red color conversion layer 116, the dielectric layer 148, the green light filter layer 150 or the red light filter layer 152 shown in the embodiments illustrated in FIGS. 1-17.

The embodiments shown in FIGS. 18A, 18B, 19A-19C and 20A-20B form fluorine (F) on the spacer layer 202 or the spacer structure 210 to adjust the contact angle of the spacer layer 202 or the spacer structure 210 to water. However, the scope of disclosure is not intended to be limiting to fluorine (F). The contact angle of the spacer layer 202 or the spacer structure 210 to water may be in a range of about 90° to about 150° by forming other elements on the surface of the spacer layer 202 or the spacer structure 210.

In addition, the volume of sprayed or coated materials by different nozzles may be different than each other due to the difference between each of the nozzles. Therefore, if the sprayed material is sprayed into pixels in the same column or row by the same nozzle, there is a problem of linear mura in the color conversion layer, the dielectric layer or the light filter layer. In some embodiments, it combines mosaic printing and mixing nozzle printing to alleviate the mura problem.

More specifically, mosaic printing means using a plurality of nozzles to spray or coat the material into different columns or rows randomly, rather than using the same nozzle to spray or coat the material into the same column or row. As a result, linear (column or row) mura caused by difference between nozzles is prevented.

Mixing nozzle printing means using two or more nozzles to spray or coat material into one pixel to form the color conversion layer, the dielectric layer or the light filter layer. As first, volumes sprayed by different nozzles are measured, respectively. Next, group and combine nozzles according to the above measured volumes. For example, two or more nozzles may be used to spray the material into one pixel. Similarly, different nozzles are used to spray the material into different pixels. As a result, the thicknesses of different pixels are substantially equal. In other embodiments, substantially equal thicknesses of the color conversion layer, the dielectric layer or the light filter layer are formed in different pixels by combining mosaic printing and mixing nozzle printing.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising:
    a substrate;
    a plurality of pixels disposed on the substrate, wherein one of the plurality of pixels comprises:
        a color conversion layer;
        a dielectric layer disposed on the color conversion layer, wherein a refractive index of the dielectric layer is less than a refractive index of the color conversion layer; and
        a light filter layer disposed on the dielectric layer;
    a first light shielding layer defining a plurality of openings, wherein at least one of the color conversion layer, the dielectric layer and the light filter layer is disposed in the plurality of openings;
    a second light shielding layer disposed on the substrate and at least partially overlapped with the first light shielding layer, and the second light shielding layer defining another plurality of openings;
    a spacer element disposed between the first light shielding layer and the second light shielding layer; and
    a plurality of light emitting diodes disposed in the another plurality of openings,
    wherein in a direction parallel to an upper surface of the substrate, the second light shielding layer overlaps the plurality of light emitting diodes.

2. The display device as claimed in claim 1, wherein the light filter layer is a yellow light filter layer, and the color conversion layer is a red color conversion layer.

3. The display device as claimed in claim 1, wherein the light filter layer is a yellow light filter layer, and the color conversion layer is a green color conversion layer.

4. The display device as claimed in claim 1, wherein a difference between the refractive index of the dielectric layer and the refractive index of the color conversion layer is greater than or equivalent to 0.05, and less than or equivalent to 0.5.

5. The display device as claimed in claim 1, further comprising:
    a total reflection layer, wherein the total reflection layer overlaps the first light shielding layer.

6. The display device as claimed in claim 1, wherein a contact angle between the first light shielding layer and water is within a range of 90° to 150°.

7. The display device as claimed in claim 1, wherein the first shielding layer contains fluorine elements or function groups with fluorine.

8. The display device as claimed in claim 1, wherein an area of the dielectric layer projecting onto a substrate of the display device is greater than an area of the color conversion layer projecting onto the substrate of the display device along a normal direction of the substrate.

9. The display device as claimed in claim 1, further comprising an adhesive layer disposed between the first light shielding layer and the second light shielding layer.

10. The display device as claimed in claim 1, wherein a shape of the plurality of openings are different from a shape of the another plurality of openings.

11. A display device, comprising:
    a substrate;
    a plurality of pixels disposed on the substrate, wherein one of the plurality of pixels comprises:
        a first color conversion layer;
        a first light filter layer disposed on the first color conversion layer; and
        a dielectric layer disposed between the first light filter layer and the first color conversion layer, wherein a refractive index of the dielectric layer is less than a refractive index of the first light filter layer;
    a first light shielding layer defining a plurality of openings, wherein at least one of the first color conversion layer, the dielectric layer and the first light filter layer is disposed in the plurality of openings;

a second light shielding layer disposed on the substrate and at least partially overlapped with the first light shielding layer, and the second light shielding layer defining another plurality of openings;

a spacer element disposed between the first light shielding layer and the second light shielding layer; and a plurality of light emitting diodes disposed in the another plurality of openings, wherein in a direction parallel to an upper surface of the substrate, the second light shielding layer overlaps the plurality of light emitting diodes.

12. The display device as claimed in claim 11, wherein a difference between the refractive index of the dielectric layer and the refractive index of the first color conversion layer is greater than or equivalent to 0.05, and less than or equivalent to 0.5.

13. The display device as claimed in claim 11, wherein the first light shielding layer and the second light shielding layer are separated via an intermediate layer.

14. The display device as claimed in claim 11, wherein a contact angle between the first light shielding layer and water is within a range of 90° to 150°.

15. The display device as claimed in claim 11, further comprising:

an adhesive layer disposed between the first light shielding layer and the second light shielding layer, wherein the pixels are separated from the light emitting diodes via the adhesive layer.

16. The display device as claimed in claim 11, further comprising a filler disposed in the another plurality of openings and located between the substrate and the adhesive layer.

17. A display device, comprising:

a substrate;

a plurality of pixels disposed on the substrate, wherein one of the plurality of pixels comprises:
  a first color conversion layer; and
  a first light filter layer disposed on the first color conversion layer;
  a first light shielding layer defining a plurality of openings, wherein at least one of the first color conversion layer and the first light filter layer is disposed in the plurality of openings;

a second light shielding layer disposed on the substrate and at least partially overlapped with the first light shielding layer, and the second light shielding layer defining another plurality of openings;

a spacer element disposed between the first light shielding layer and the second light shielding layer; and a plurality of light emitting diodes disposed in the another plurality of openings, wherein the first shielding layer contains fluorine elements or function groups with fluorine, and in a direction parallel to an upper surface of the substrate, the second light shielding layer overlaps the plurality of light emitting diodes.

18. The display device as claimed in claim 17, wherein a shape of the plurality of openings are different from a shape of the another plurality of openings.

19. The display device as claimed in claim 17, further comprising a dielectric layer disposed between the first light filter layer and the first color conversion layer, wherein a refractive index of the dielectric layer is less than a refractive index of the first light filter layer, and a difference between the refractive index of the dielectric layer and the refractive index of the first color conversion layer is greater than or equivalent to 0.05, and less than or equivalent to 0.5.

* * * * *